United States Patent
Okada

(10) Patent No.: US 10,131,984 B2
(45) Date of Patent: Nov. 20, 2018

(54) SUBSTRATE PROCESSING APPARATUS

(71) Applicant: Hitachi Kokusai Electric Inc., Tokyo (JP)

(72) Inventor: Satoshi Okada, Toyama (JP)

(73) Assignee: KOKUSAI ELECTRIC CORPORATION, Tokyo (JP)

( * ) Notice: Subject to any disclaimer, the term of this patent is extended or adjusted under 35 U.S.C. 154(b) by 1049 days.

(21) Appl. No.: 13/965,242

(22) Filed: Aug. 13, 2013

(65) Prior Publication Data

US 2013/0327273 A1   Dec. 12, 2013

Related U.S. Application Data

(62) Division of application No. 12/712,744, filed on Feb. 25, 2010, now abandoned.

(30) Foreign Application Priority Data

| Feb. 27, 2009 | (JP) | ................................. 2009-045579 |
| Jan. 28, 2010 | (JP) | ................................. 2010-016416 |

(51) Int. Cl.
  *C23C 16/455*  (2006.01)
  *H01L 21/673*  (2006.01)
  (Continued)

(52) U.S. Cl.
  CPC .......... *C23C 16/00* (2013.01); *C23C 16/4405* (2013.01); *C23C 16/45519* (2013.01);
  (Continued)

(58) Field of Classification Search
  None
  See application file for complete search history.

(56) References Cited

U.S. PATENT DOCUMENTS

| 6,065,615 A * | 5/2000 | Uchiyama ......... H01L 21/67303 |
| | | 118/500 |
| 2005/0287806 A1 * | 12/2005 | Matsuura ................ C23C 16/36 |
| | | 438/680 |

(Continued)

FOREIGN PATENT DOCUMENTS

| CN | 101051606 | 10/2007 |
| JP | 2004273605 | 9/2004 |

(Continued)

*Primary Examiner* — Karla A Moore
(74) *Attorney, Agent, or Firm* — Brundidge & Stanger, P.C.

(57) ABSTRACT

Provided is a substrate processing apparatus. The apparatus includes: a process chamber configured to accommodate substrates which are horizontally oriented and stacked in multiple stages and process the substrates; a process gas supply unit configured to supply a process gas to the process chamber; an inert gas supply unit configured to supply an inert gas to the process chamber; and an exhaust unit configured to exhaust the process chamber. The process gas supply unit includes a process gas supply nozzle. The inert gas supply unit includes inert gas supply nozzles disposed at both sides of the process gas supply nozzle. Each of the inert gas supply nozzles includes at least one first inert gas ejection hole formed in a region where the substrates are stacked and at least one second inert gas ejection hole formed in a region where the substrates are not stacked.

4 Claims, 14 Drawing Sheets

(51) Int. Cl.
*C23C 16/00* (2006.01)
*C23C 16/44* (2006.01)
*H01L 21/67* (2006.01)

(52) U.S. Cl.
CPC .. *C23C 16/45546* (2013.01); *C23C 16/45578* (2013.01); *H01L 21/67109* (2013.01); *C23C 16/45517* (2013.01); *C23C 16/45574* (2013.01); *H01L 21/67303* (2013.01); *H01L 21/67309* (2013.01)

(56) References Cited

U.S. PATENT DOCUMENTS

| | | | |
|---|---|---|---|
| 2007/0010072 A1* | 1/2007 | Bailey | C23C 16/308 438/478 |
| 2007/0095288 A1 | 5/2007 | Saito et al. | |
| 2007/0234961 A1 | 10/2007 | Takahashi et al. | |
| 2008/0026251 A1* | 1/2008 | Suzuki | C23C 16/405 428/702 |
| 2008/0132083 A1 | 6/2008 | Matsuura | |
| 2009/0032190 A1 | 2/2009 | Takahashi | |
| 2010/0218724 A1 | 9/2010 | Okada | |

FOREIGN PATENT DOCUMENTS

| | | |
|---|---|---|
| JP | 2005317734 | 11/2005 |
| JP | 2007109711 | 4/2007 |
| JP | 2007299776 | 11/2007 |
| KR | 1020060103128 | 9/2006 |

* cited by examiner

Fig. 9

| POSITION | UPPER | MIDDLE | LOWER |
|---|---|---|---|
| THICKNESS DISTRIBUTION | | | |
| AVG. THICKNESS [Å] | 37.6 | 36.7 | 36.5 |
| IN-SURFACE UNIFORMITY [%] | ±9.7 | ±8.5 | ±7.3 |
| INTER-WAFER UNIFORMITY [%] | | ±1.4 | |

Fig. 10

| POSITION | UPPER | MIDDLE | LOWER |
|---|---|---|---|
| THICKNESS DISTRIBUTION | | | |
| AVG. THICKNESS [Å] | 33.7 | 33.6 | 33.6 |
| IN-SURFACE UNIFORMITY [%] | ±3.8 | ±3.7 | ±4.1 |
| INTER-WAFER UNIFORMITY [%] | ±0.2 | | |

SUBSTRATE PROCESSING APPARATUS

CROSS-REFERENCE TO RELATED PATENT APPLICATION

The present application is a Divisional Application of application Ser. No. 12/712,744, filed Feb. 25, 2010; which claims priority under 35 U.S.C. § 119 of Japanese Patent Application No. 2009-045579, filed Feb. 27, 2009 and Japanese Patent Application No. 2010-016416, filed Jan. 28, 2010, the entire disclosures of which are hereby incorporated by reference.

BACKGROUND OF THE INVENTION

1. Field of the Invention

The present invention relates to a substrate processing apparatus for performing a substrate processing process.

2. Description of the Prior Art

Conventionally, as one of processes for manufacturing a semiconductor device such as dynamic random access memory (DRAM), a substrate processing process for forming a thin film on a substrate is performed. Such a substrate processing process is performed by using a substrate processing apparatus including a process chamber configured to accommodate substrates which are horizontally positioned and arranged in multiple stages, a process gas supply nozzle configured to supply a process gas to the process chamber, and an exhaust line configured to exhaust the process chamber. A substrate holding tool in which a plurality of substrates are held is loaded into the process chamber, and while exhausting the process chamber through the exhaust line, a gas is supplied to the process chamber through the process gas supply nozzle, so as to make the gas flow through the substrates for forming thin films on the substrates.

However, in the above-described substrate processing process, process gas supplied to the process chamber may flow to a region where substrates are not stacked (for example, a region higher or lower than a region where the substrates are stacked) instead of flowing between the substrates. In this case, the amount of process gas supplied to the substrates is decreased to lower the film-forming rate or in-surface or inter-substrate processing uniformity.

In addition, a process gas flowing to a region where substrates are not stacked may be attached to the inner wall of the process chamber and form a thin film which generate contaminates.

Particularly, in the region where substrates are not stacked, if the inner wall of the process chamber has a low temperature, a thin film may be easily formed on the inner wall. In addition, if the inner wall of the process chamber has a low temperature, a thin film may not be easily removed by gas cleaning (dry cleaning).

SUMMARY OF THE INVENTION

An object of the present invention is to provide a substrate processing apparatus capable of suppressing supplying of a process gas to a region where substrates are not stacked and facilitating supply of a process gas to a region where substrates are stacked.

According to an aspect of the present invention, there is provided a substrate processing apparatus including:

a process chamber configured to accommodate and process substrates which are horizontally oriented and stacked in multiple stages;

a process gas supply unit configured to supply a process gas to the process chamber;

an inert gas supply unit configured to supply an inert gas to the process chamber; and an exhaust unit configured to exhaust the process chamber, wherein the process gas supply unit includes a process gas supply nozzle extending along an inner wall of the process chamber in a stacked direction of the substrates so as to supply the process gas to the process chamber, the inert gas supply unit includes inert gas supply nozzles which extend along the inner wall of the process chamber in the stacked direction of the substrates and are disposed at both sides of the process gas supply nozzle along a circumferential direction of the substrates, so as to supply the inert gas to the process chamber, and each of the inert gas supply nozzles includes at least one first inert gas ejection hole formed in a region where the substrates are stacked and at least one second inert gas ejection hole formed in a region where the substrates are not stacked.

According to another aspect of the present invention, there is provided a substrate processing apparatus including:

a substrate holding tool configured to hold substrates in a state where the substrates are horizontally oriented and stacked in multiple stages;

a process chamber configured to accommodate the substrate holding tool in which the substrates are held so as to process the substrates;

a process gas supply unit configured to supply a process gas to the process chamber;

an inert gas supply unit configured to supply an inert gas to the process chamber; and an exhaust unit configured to exhaust the process chamber, wherein the process gas supply unit includes a process gas supply nozzle extending along an inner wall of the process chamber in a stacked direction of the substrates so as to supply the process gas to the process chamber, the inert gas supply unit includes an inert gas supply nozzle extending along the inner wall of the process chamber in the stacked direction of the substrates so as to supply the inert gas to the process chamber, and the inert gas supply nozzle includes at least one inert gas ejection hole formed in a region where the substrates are not stacked.

According to another aspect of the present invention, there is provided a substrate processing apparatus including:

a process chamber configured to accommodate and process substrates which are horizontally oriented and stacked in multiple stages;

a process gas supply unit configured to supply a process gas to the process chamber;

an inert gas supply unit configured to supply an inert gas to the process chamber; and an exhaust unit configured to exhaust the process chamber, wherein the process gas supply unit includes a process gas supply nozzle extending along an inner wall of the process chamber in a stacked direction of the substrates and including a process gas ejection hole to supply the process gas to the process chamber, the inert gas supply unit includes an inert gas supply nozzle which extends along the inner wall of the process chamber in the stacked direction of the substrates and is disposed adjacent to the process gas supply nozzle in a circumferential direction of the substrates, so as to supply the inert gas to the process chamber, and the inert gas supply nozzle includes inert gas ejection holes formed at positions higher and/or lower than a region where the process gas ejection hole is formed in the process gas supply nozzle.

BRIEF DESCRIPTION OF THE DRAWINGS

FIG. 9 is a table showing results of substrate processing in a comparative example.

FIG. 10 is a table showing results of substrate processing according to an embodiment of the present invention.

DETAILED DESCRIPTION OF THE PREFERRED EMBODIMENTS

The inventors have studied a method of facilitating supply of a process gas to a region where substrates are stacked by suppressing supply of the process gas to a region where the substrates are not stacked. As a result, the inventors have found that the above-mentioned subject can be solved as follows: when a process gas is supplied to a process chamber, an inert gas is supplied to both sides of the process gas, and at the same time, the inert gas is supplied to a region where substrates are not stacked (for example, a region higher or lower than a region where substrates are stacked). The present invention is provided based on the knowledge of the inventors.

Embodiment of Invention

An embodiment of the present invention will be hereinafter described with reference to the attached drawings.

(1) Structure of Substrate Processing Apparatus

Figure 8:
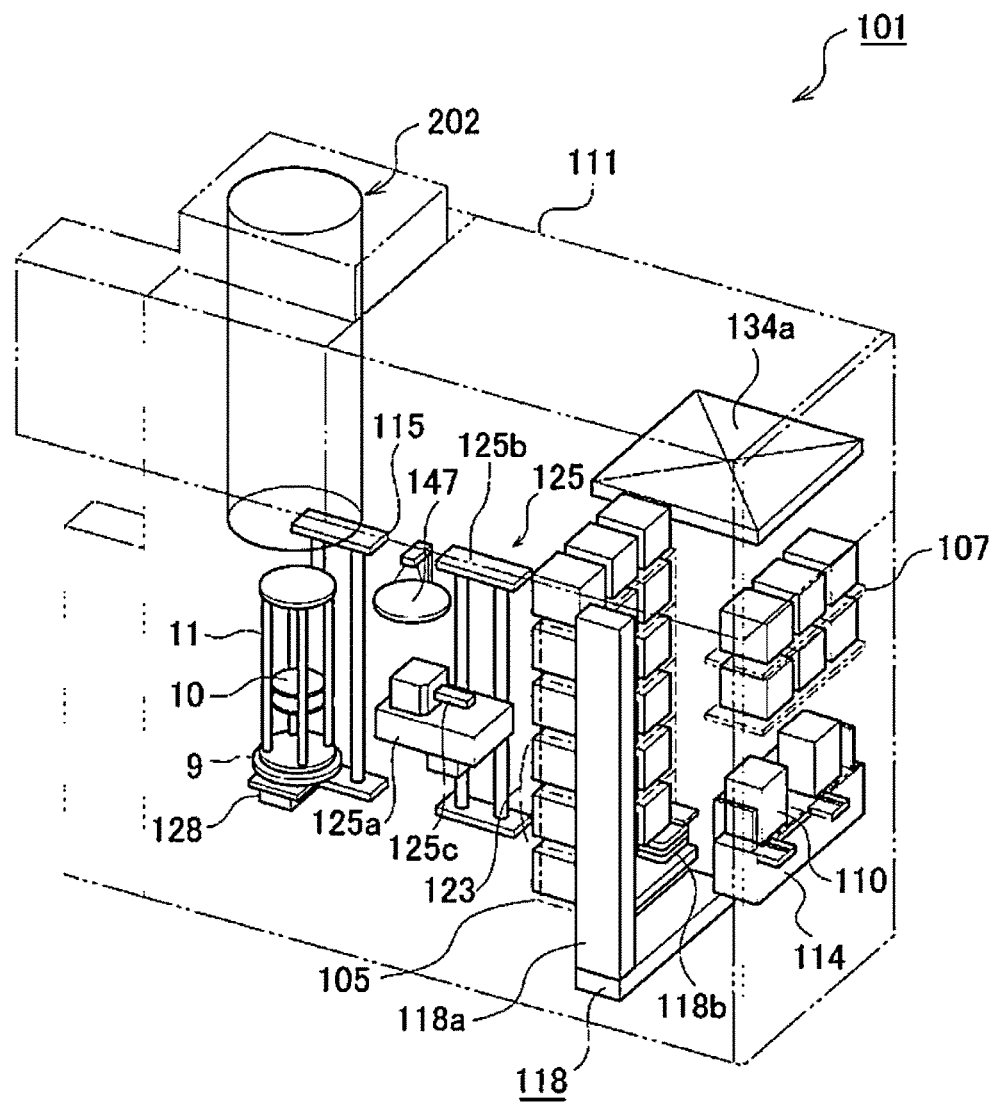
FIG. 8 is a schematic view illustrating a substrate processing apparatus according to an embodiment of the present invention.

First, an explanation will be given on the structure of a substrate processing apparatus 101 configured to perform a substrate processing process as one of semiconductor device manufacturing processes. FIG. 8 is a perspective view illustrating the substrate processing apparatus 101 according to the current embodiment.

As shown in FIG. 8, the substrate processing apparatus 101 of the current embodiment includes a case 111. To carry wafers (substrates) 10 made of a material such as silicon into and out of the case 111, cassettes 110 are used as wafer carriers (substrate containers) each capable of accommodating a plurality of wafers 10. At the front side in the case 111, a cassette stage (substrate container stage) 114 is installed. The cassettes 110 are configured to be placed on the cassette stage 114 and carried away from the cassette stage 114 to an outside area of the case 111 by an in-process carrying device (not shown).

A cassette 110 is placed on the cassette stage 114 by the in-process carrying device in a manner such that wafers 10 placed in the cassette 110 are vertically positioned and a wafer taking in/out entrance of the 110 faces upward. The cassette stage 114 is configured to rotate the cassette 110 by 90° counterclockwise in a longitudinal direction toward the backside of the case 111 so as to position the wafers 10 of the cassette 110 horizontally and point the wafer taking in/out entrance of the cassette 110 to the backside of the case 111.

At about the center part in the case 111 in a front-to-back direction, a cassette shelf (substrate container shelf) 105 is installed. The cassette shelf 105 is configured to store a plurality of cassettes 110 in a plurality of rows and columns. At the cassette shelf 105, a transfer shelf 123 is installed to store cassettes 110, which are carrying objects of a wafer transfer mechanism 125 (described later). At the upside of the cassette stage 114, a standby cassette shelf 107 is installed to store standby cassettes 110.

Between the cassette stage 114 and the cassette shelf 105, a cassette carrying device (substrate container carrying device) 118 is installed. The cassette carrying device 118 includes a cassette elevator (substrate container elevating mechanism) 118a capable of moving upward and downward while holding a cassette 110, and a cassette carrying mechanism (substrate container carrying mechanism) 118b capable of moving horizontally while holing a cassette 110. The cassette carrying device 118 is configured to carry cassettes 110 among the cassette stage 114, the cassette shelf 105, the standby cassette shelf 107, and the transfer shelf 123 by cooperative motions of the cassette elevator 118a and the cassette carrying mechanism 118b.

At the backside of the cassette shelf 105, the wafer transfer mechanism (substrate transfer mechanism) 125 is installed. The wafer transfer mechanism 125 includes a wafer transfer device (substrate transfer device) 125a configured to rotate or linearly move wafers 10 in a horizontal direction, and a wafer transfer device elevator (substrate transfer device elevating mechanism) 125b configured to move the wafer transfer device 125a upward and downward. The wafer transfer device 125a includes a tweezers (substrate transfer jig) 125c configured to hold a wafer 10 horizontally. By cooperative motions of the wafer transfer device 125a and the wafer transfer device elevator 125b, a wafer 10 can be picked up from a cassette 110 placed on the transfer shelf 123 and be charged into a boat (substrate holding tool) 11 (described layer), or a wafer 10 can be discharged from the boat 11 and be accommodated in a cassette 110 placed on the transfer shelf 123.

At the upside of the rear part of the case 111, a process furnace 202 is installed. An opening is formed in the bottom side of the process furnace 202. The opening of the process furnace 202 is configured to be opened and closed by a furnace port shutter (furnace port opening/closing mechanism) 147. The structure of the process furnace 202 will be described later.

At the downside of the process furnace 202, a boat elevator (substrate holding tool elevating mechanism) 115 is installed as an elevating mechanism for moving the boat 11 upward to and downward from the process furnace 202. At an elevating table of the boat elevator 115, an arm 128 is installed as a connecting tool. At the arm 128, a seal cap 9 is horizontally installed to support the boat 11 vertically and function as a cover for hermetically sealing the bottom side of the process furnace 202 when the boat 11 is moved upward by the boat elevator 115.

The boat 11 includes a plurality of holding members, and is configured to hold a plurality of wafers 10 (for example, about fifty to one hundred fifty wafers) horizontally in a state that the wafers 10 are vertically arranged with the centers of the wafers 10 being aligned. The structure of the boat 11 will be described later in detail.

At the upside of the cassette shelf 105, a cleaning unit 134a including a supply fan and a dust filter is installed. The cleaning unit 134a is configured to supply clean air as purified atmosphere to the inside of the case 111.

At the left end part of the case 111 opposite to the wafer transfer device elevator 125b and the boat elevator 115, another cleaning unit (not shown) including a supply fan and a dust filter is installed to supply clean air. Clean air blown from the other cleaning unit flows around the wafer transfer device 125a and the boat 11, and is then sucked by an exhaust device (not shown) and is exhausted to the outside of the case 111.

(2) Operation of Substrate Processing Apparatus

Next, an explanation will be given on an operation of the substrate processing apparatus 101 of the current embodiment.

A cassette 110 is carried to and placed on the cassette stage 114 by the in-plant carrying unit (not shown) in a manner such that wafers 10 inside the cassette 110 are vertically positioned and the wafer taking in/out entrance of the cassette 110 faces upward. Thereafter, the cassette 110 is rotated counterclockwise by 90° in a longitudinal direction toward the backside of the case 111 by the cassette stage 114. As a result, the wafers 10 inside the cassette 110 are horizontally positioned and the wafer taking in/out entrance of the cassette 110 faces the backside of the case 111.

Then, the cassette 110 is automatically carried and placed by the cassette carrying device 118 to a specified shelf position of the cassette shelf 105 or the standby cassette shelf 107 so as to be temporarily stored, and is then transferred to the transfer shelf 123 from the cassette shelf 105 or the standby cassette shelf 107 by the cassette carrying device 118. Alternatively, the carry cassette 110 may be directly transferred to the transfer shelf 123 from the cassette stage 114.

After the cassette 110 is transferred to the transfer shelf 123, wafers 10 are picked up from the cassette 110 through the wafer taking in/out entrance of the cassette 110 by the tweezers 125c of the wafer transfer device 125a, and then the wafers 10 are charged into the boat 11 placed at the backside of a transfer chamber 124 by cooperative motions of the wafer transfer device 125a and the wafer transfer device elevator 125b. After delivering the wafer 10 to the boat 11, the wafer transfer mechanism 125 returns to the cassette 110 to charge the next wafers 10 into the boat 11.

After a predetermined number of wafers 10 are charged into the boat 11, the opening of the bottom side of the process furnace 202 closed by the furnace port shutter 147 is opened by moving the furnace shutter 147. Subsequently, the boat 11 holding a group of wafers 10 is loaded into the process furnace 202 by an ascending motion of the boat elevator 115. After the loading, a predetermined process is performed on the wafers 10 placed in the process furnace 202. Such a predetermined process will be described later. Thereafter, the wafers 10 and the cassette 110 are carried to the outside of the case 111 in a reverse sequence of the above.

(3) Structure of Process Furnace

Figure 1:
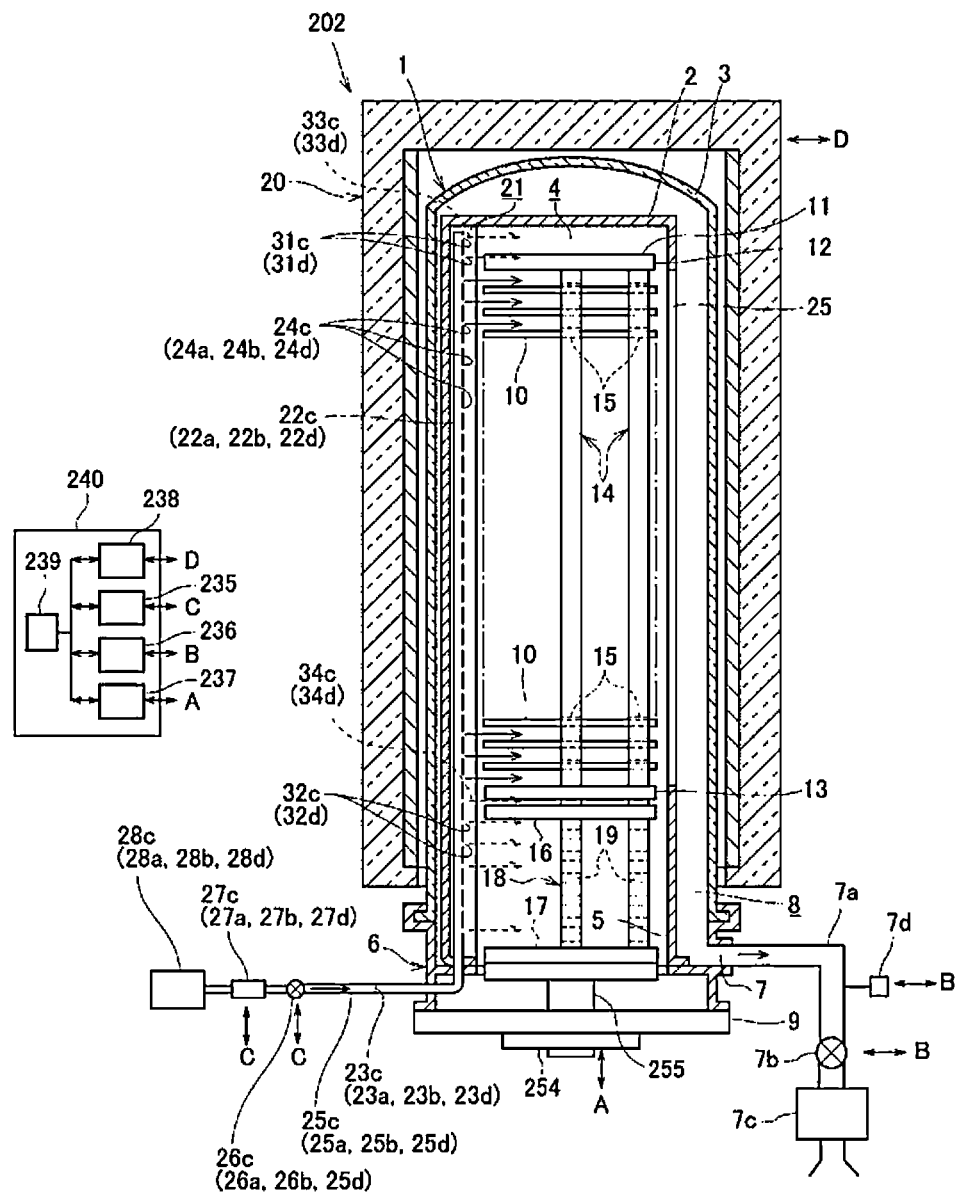
FIG. 1 is a vertical sectional view illustrating a process furnace of a substrate processing apparatus according to an embodiment of the present invention.
Figure 2:
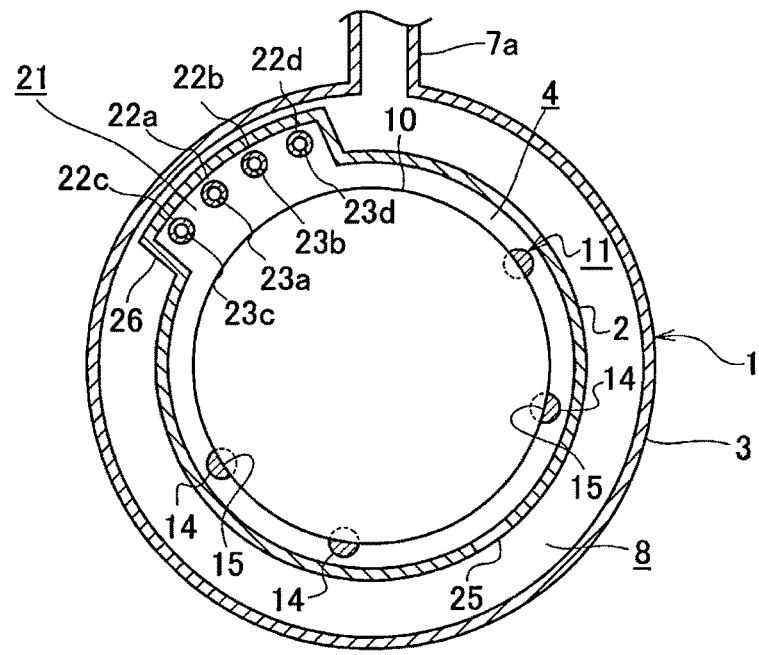
FIG. 2 is a horizontal sectional view illustrating the process furnace of the substrate processing apparatus according to an embodiment of the present invention.
Figure 3:
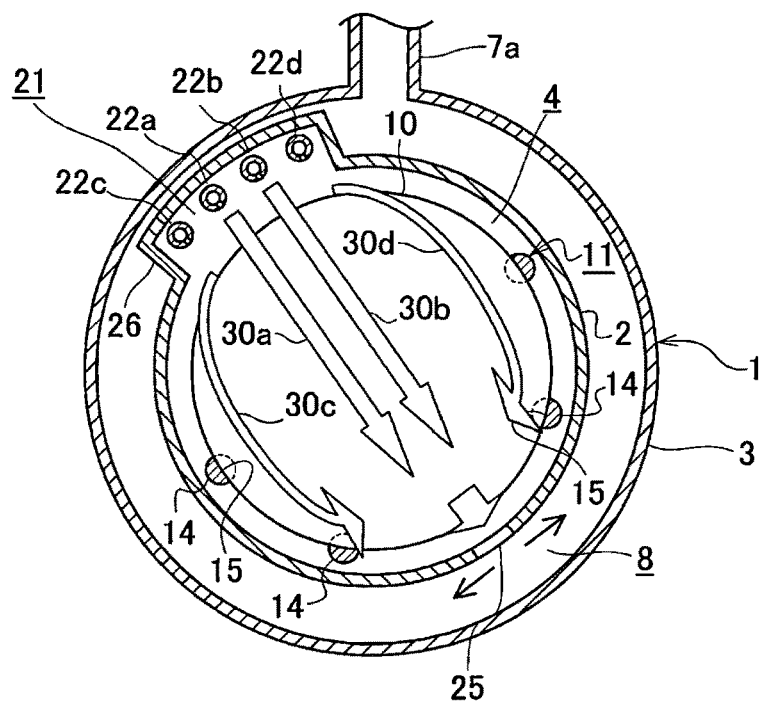
FIG. 3 is a schematic view illustrating flows of a process gas and an inert gas inside the process furnace.
Figure 13:
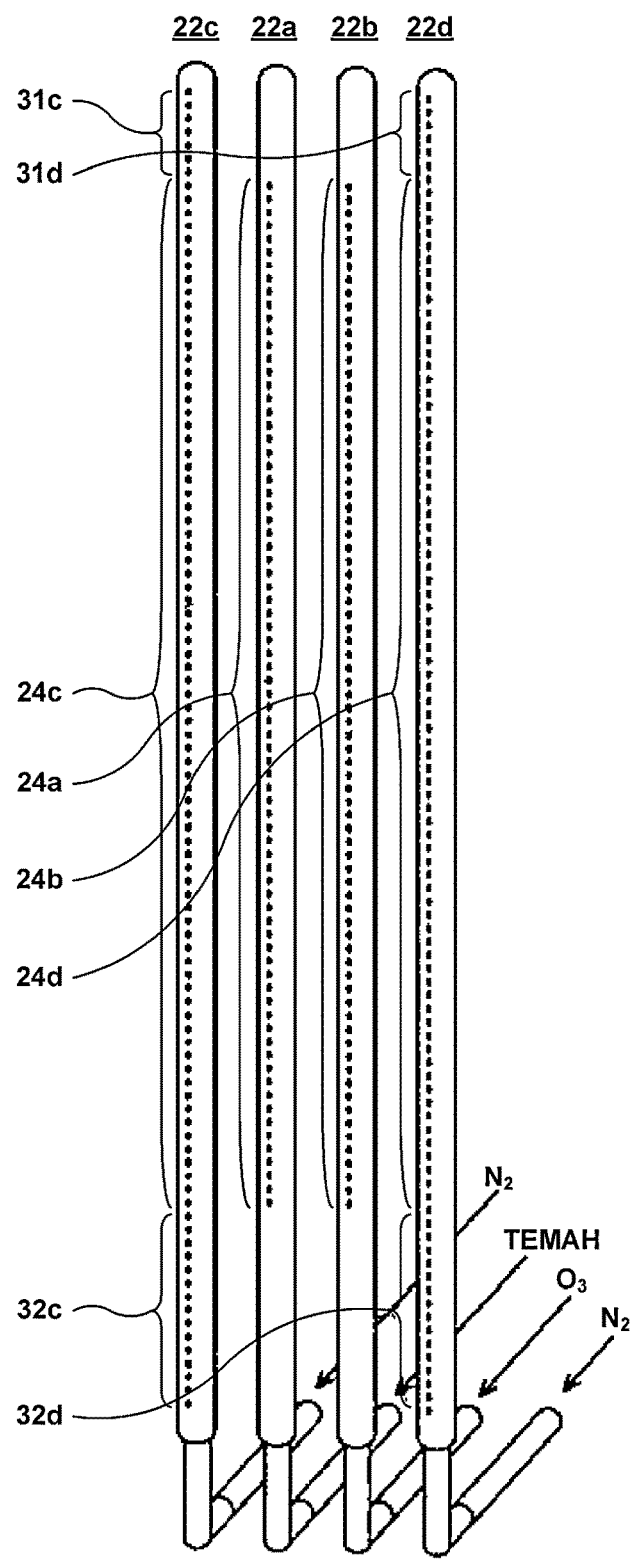
FIG. 13 is a schematic view illustrating inert gas supply nozzles and process gas supply nozzles according to an embodiment of the present invention.

Next, an explanation will be given on the structure of the process furnace 202 of the current embodiment. FIG. 1 is a vertical sectional view illustrating the process furnace 202 of the substrate processing apparatus 101 according to an embodiment of the present invention; FIG. 2 is a horizontal sectional view illustrating the process furnace 202 of the substrate processing apparatus 101 according to an embodiment of the present invention; FIG. 3 is a schematic view illustrating flows of a process gas and an inert gas inside the process furnace 202; and FIG. 13 is a schematic view illustrating inert gas supply nozzles and process gas supply nozzles according to an embodiment of the present invention. As shown in FIG. 1, the process furnace 202 of the current embodiment is configured as a chemical vapor deposition (CVD) apparatus (a batch type, vertical hot-wall type, decompression CVD apparatus).

(Process Tube)

The process furnace 202 includes a vertical process tube 1. The process tube 1 is longitudinally disposed so that the centerline of the process tube 1 can be vertical, and the process tube 1 is fixedly supported by the case 111. The process tube 1 includes an inner tube 2 and an outer tube 3. Each of the inner tube 2 and the outer tube 3 is made of a heat-resistant material such as quartz ($SiO_2$) or silicon carbide (SiC) and has a one-piece cylinder shape.

The inner tube 2 has a cylindrical shape with a closed top side and an opened bottom side. In the inner tube 2, a process chamber 4 is formed to accommodate and process wafers 10 which are horizontally oriented and stacked in multiple stages by the boat 11 (substrate holding tool). The opened bottom side of the inner tube 2 forms a furnace port 5 through which the boat 11 holding a group of wafers 10 can be loaded and unloaded. Therefore, the inner diameter of the inner tube 2 is set to be greater than the maximum outer diameter of the top plate 211 holding a group of wafers 10. The outer tube 3 is similar to but greater than the inner tube 2; and has a cylindrical shape with a closed top side and an opened bottom side. The outer tube 3 is concentrically disposed around the inner tube 2. The lower end parts of the inner tube 2 and the outer tube 3 are hermetically sealed by a ring-shaped manifold 6. The manifold 6 is detachably mounted on the inner tube 2 and the outer tube 3 so as to perform maintenance, inspection, or cleaning works on the inner tube 2 and the outer tube 3. The manifold 6 is supported by the case 111, and in this state, the process tube 1 can be vertically fixed.

(Exhaust Unit)

An exhaust pipe 7a is connected to a part of the sidewall of the manifold 6 as an exhaust line for exhausting the inside atmosphere of the process chamber 4. At the joint part between the manifold 6 and the exhaust pipe 7a, an exhaust port 7 is formed for exhausting the inside atmosphere of the process chamber 4. The inside of the exhaust pipe 7a is connected through the exhaust port 7 to an exhaust passage 8 formed by a gap between the inner tube 2 and the outer tube 3. The exhaust passage 8 has a ring-shaped cross section having a constant width. At the exhaust pipe 7a, a pressure sensor 7d, an auto pressure controller (APC) valve 7b as a pressure regulating valve, and a vacuum pump 7c as a vacuum exhaust device are sequentially installed from the upstream side of the exhaust pipe 7a. The vacuum pump 7c is configured to evacuate the inside of the process chamber 4 to a predetermined pressure (vacuum degree). A pressure control unit 236 is electrically connected to the APC valve 7b and the pressure sensor 7d. The pressure control unit 236 is configured to control the degree of opening of the APC valve 7b based on pressure information detected by the pressure sensor 7d so as to adjust the inside pressure of the process chamber 4 to a desired pressure value at a desired time. An exhaust unit of the current embodiment is constituted mainly by the exhaust pipe 7a, the exhaust port 7, the exhaust passage 8, the pressure sensor 7d, the APC valve 7b, and the vacuum pump 7c.

(Substrate Holding Tool)

At the manifold 6, the seal cap 9 is installed in a manner such that the seal cap 9 can be brought into contact with the manifold 6 in a vertical direction from the bottom side of the manifold 6 so as to seal the opened bottom side of the manifold 6. The seal cap 9 has a disk shape with a diameter equal to or greater than the outer diameter of the outer tube 3, and by the boat elevator 115 vertically installed at the outside of the process tube 1, the seal cap 9 is vertically moved in a state where the seal cap 9 is horizontally oriented.

The boat 11 is vertically erected and supported on the seal cap 9 as a substrate holding tool for holding wafers 10. The boat 11 includes a pair of upper and lower end plates 12 and 13, and a plurality of lines of holding members 14 vertically installed between the end plates 12 and 13. The end plates 12 and 13, and the holding members 14 are made of a heat-resistant material such as quartz ($SiO_2$) or silicon carbide (SiC). At each of the holding members 14, a plurality of holding grooves 15 are formed at regular intervals along the length direction of the holding member 14. The holding grooves 15 of the holding members 14 are formed to face each other. The circumferential edge of a wafer 10 is inserted into equal-height holding grooves 15 of the holding members 14 such that a plurality of wafers 10 can be horizontally oriented and stacked in multiple stages with their centers being aligned with each other.

In addition, between the boat 11 and the seal cap 9, a pair of upper and lower auxiliary end plates 16 and 17 are installed in a manner such that the auxiliary end plates 16 and 17 are supported by a plurality of lines of auxiliary holding members 18. At each of the auxiliary holding members 18, a plurality of holding grooves 19 is formed. The holding grooves 19 are shaped such that a plurality of disk-shaped insulating plates (not shown) made of a heat-resistant material such as quartz ($SiO_2$) or silicon carbide (SiC) can be horizontally oriented and charged in multiple stages. Owing to the insulating plates (not shown), heat transfer from a heater unit (described later) to the manifold 6 can be prevented.

At a side of the seal cap 9 opposite to the process chamber 4, a rotary mechanism 254 is installed to rotate the boat 11. A rotation shaft 255 of the rotary mechanism 254 is inserted through the seal cap 9 to support the boat 11 from the bottom side of the boat 11. By rotating the rotation shaft 255, wafers 10 placed in the process chamber 4 can be rotated. The seal cap 9 is configured to be vertically moved by the above-described boat elevator 115, and by using this, the boat 11 can be carried into and away from the process chamber 4.

A driving control unit 237 is electrically connected to the rotary mechanism 254 and the boat elevator 115. The driving control unit 237 is configured to perform a control operation so that the rotary mechanism 254 and the boat elevator 115 can be operated in a desired manner at a desired time.

(Heater Unit)

At the outside of the outer tube 3, a heater unit 20 is installed around the outer tube 3 as a heating mechanism configured to heat the inside of the process tube 1 uniformly or in a predetermined temperature distribution pattern. The heater unit 20 is supported by the case 111 of the substrate processing apparatus 101 in a manner such that the heater unit 20 can be vertically fixed, and the heater unit 20 may be configured by a resistance heating heater such as a carbon heater.

In the process tube 1, a temperature sensor (not shown) is installed as a temperature detector. A temperature control unit 238 is electrically connected to the heater unit 20 and the temperature sensor. The temperature control unit 238 is configured to control power supply to the heater unit 20 based on temperature information detected by the temperature sensor so as to obtain desired temperature distribution in the process chamber 4 at a desired time.

A heating unit of the current embodiment is constituted mainly by the heater unit 20 and the temperature (not shown).

(Process Gas Supply Unit and Inert Gas Supply Unit)

At a position of the sidewall of the inner tube 2 (opposite to or 180 degrees apart from an exhaust opening 25 (described later)), a channel-shaped auxiliary chamber 21 is formed in a manner such that the auxiliary chamber 21 protrudes outward in a radial direction from the sidewall of the inner tube 2 and extends in a vertical direction. A sidewall 26 of the auxiliary chamber 21 forms a part of the sidewall of the inner tube 2. In addition, the inner wall of the auxiliary chamber 21 forms a part of the inner wall of the inner tube 2. In the auxiliary chamber 21, process gas supply nozzles 22a and 22b are installed in a manner such that the process gas supply nozzles 22a and 22b extend along the inner wall of the auxiliary chamber 21 (that is, the inner wall of the inner tube 2) in a direction where wafers 10 are stacked, so as to supply process gas to the inside of the process chamber 4. Furthermore, in the auxiliary chamber 21, a pair of inert gas supply nozzles 22c and 22d are installed, in a manner such that the inert gas supply nozzles 22c and 22d extend along the inner wall of the auxiliary chamber 21 (that is, the inner wall of the inner tube 2) in a direction where wafers 10 are stacked, and the inert gas supply nozzles 22c and 22d are disposed along the circumferential direction of wafers 10 with the process gas supply nozzles 22a and 22b being disposed between the inert gas supply nozzles 22c and 22d, so as to supply inert gas to the inside of the process chamber 4.

Process gas introducing parts 23a and 23b, which are upstream-side end parts of the process gas supply nozzles 22a and 22b, and inert gas introducing parts 23c and 23d, which are upstream-side end parts of the inert gas supply nozzles 22c and 22d, are inserted through the sidewall of the manifold 6 in a radial direction of the manifold 6 and are protruded outward from the outside of the manifold 6.

Process gas supply pipes 25a and 25b are connected to the process gas introducing parts 23a and 23b as process gas supply lines.

At the process gas supply pipe 25a, a process gas supply source 28a configured to supply a process gas, a flowrate control device such as a mass flow controller (MFC) 27a, and an on-off valve 26a are installed from the upstream side of the process gas supply pipe 25a. Examples of a process gas that can be supplied from the process gas supply source 28a include: TEMAH gas obtained by vaporizing tetrakis ethy methyl amino hafnium (TEMAH, Hf[N(CH$_3$)(C$_2$H$_5$)]$_4$); TEMAZ gas obtained by vaporizing tetrakis ethyl methyl amino zirconium (TEMAZ, Zr[N(CH$_3$)(C$_2$H$_5$)]$_4$); and TMA gas obtained by vaporizing trimethylaluminium (TMA, (CH$_3$)$_3$Al). In this way, a gas having a thermal decomposition temperature lower than a process temperature (film-forming temperature), such as TEMAH gas, TEMAZ gas, or TMA gas, can be used as a process gas to be supplied between both-side inert gas streams. Furthermore, a carrier gas supply pipe (not shown) is connected to the downstream side of the on-off valve 26a of the process gas supply pipe 25a. A carrier gas such as N$_2$ gas is supplied through the carrier gas supply pipe so as to dilute a process gas and facilitate supply or diffusion of the process gas to the inside of the process chamber 4.

In addition, at the process gas supply pipe 25b, a process gas supply source 28b configured to supply a process gas such as ozone (O$_3$) gas, a flowrate control device such as an MFC 27b, and an on-off valve 26b are sequentially installed from the upstream side of the process gas supply pipe 25b. A carrier gas supply pipe (not shown) is connected to the downstream side of the on-off valve 26a of the process gas supply pipe 25a. Furthermore, a carrier gas supply pipe (not shown) is connected to the downstream side of the on-off valve 26b of the process gas supply pipe 25b. A carrier gas such as N$_2$ gas is supplied through the carrier gas supply pipe so as to dilute a process gas and facilitate supply or diffusion of the process gas to the inside of the process chamber 4.

Inert gas supply pipes 25c and 25d are connected to the inert gas introducing parts 23c and 23d as inert gas supply lines, respectively. At the inert gas supply pipes 25c and 25d, inert gas supply sources 28c and 28d configured to supply inert gas such as N$_2$ gas, Ar gas, or He gas; flowrate control devices such as MFCs 27c and 27d; and on-off valves 26c and 26d are sequentially installed from the upstream sides of the inert gas supply pipes 25c and 25d, respectively.

A process gas supply unit of the current embodiment is constituted mainly by the process gas supply nozzles 22a and 22b, the process gas supply pipes 25a and 25b, the process gas supply sources 28a and 28b, the MFCs 27a and 27b, the on-off valves 26a and 26b, and the two carrier gas supply pipes (not shown). In addition, an inert gas supply unit of the current embodiment is constituted mainly by the inert gas supply nozzles 22c and 22d, the inert gas supply pipes 25c and 25d, the inert gas supply sources 28c and 28d, the MFCs 27c and 27d, and the on-off valves 26c and 26d.

A gas supply/flowrate control unit 235 is electrically connected to the MFCs 27a, 27b, 27c, and 27d, and the on-off valves 26a, 26b, 26c, and 26d. In each step (described later), the gas supply/flowrate control unit 235 controls the MFCs 27a, 27b, 27c, and 27d and the on-off valves 26a, 26b, 26c, and 26d, so as to supply desired kinds of gas to the process chamber 4 at desired times with desired flowrates and desired inert gas/process gas ratios.

As shown in FIG. 1 and FIG. 3, in the process chamber 4, a plurality of process gas ejection holes 24a and 24b are formed in cylindrical bodies of the process gas supply nozzles 22a and 22b in a manner such that the process gas ejection holes 24a and 24b are vertically arranged. Furthermore, a plurality of first inert gas ejection holes 24c and 24d, and a plurality of second inert gas ejection holes 31c, 31d, 32c, and 32d are formed in cylindrical bodies of the inert gas supply nozzles 22c and 22d in a manner such that the first and second inert gas ejection holes 24c, 24d, 31c, 31d, 32c, and 32d are vertically arranged in the process chamber 4. The process gas ejection holes 24a and 24b, and the first inert gas ejection holes 24c and 24d are arranged along a region of the process chamber 4 in which wafers 10 are stacked and disposed at positions corresponding to the wafers 10. The second inert gas ejection holes 31c, 31d, 32c, and 32d are respectively formed in regions of the process chamber 4 where wafers 10 are not stacked. In detail, the second inert gas ejection holes 31c and 31d are higher than the first inert gas ejection holes 24c and 24d, and are formed in a region higher than a region where the wafers 10 are stacked. Here, the region higher than the region where the wafers 10 are stacked means a region as high as or higher than a region corresponding to the end plate 12 of the boat 11. In addition, the second inert gas ejection holes 32c and 32d are lower than the first inert gas ejection holes 24c and 24d, and are formed in a region lower than the region where the wafers 10 are stacked. Here, the region lower than the region where the wafers 10 are stacked means a region as low as or lower than a region corresponding to the end plate 13 of the boat 11. For example, the region lower than the region where the wafers 10 are stacked means a region at least corresponding to the heights of the insulating plates (not shown). Since the process gas supply nozzles 22a and 22b and the inert gas supply nozzles 22c and 22d are installed in the auxiliary chamber 21, the process gas ejection holes 24a and 24b, the first inert gas ejection holes 24c and 24d, and the second inert gas ejection holes 31c, 31d, 32c, and 32d are disposed at positions outside the inner surface of the inner tube 2 in a radial direction of the inner tube 2.

The number of the process gas ejection holes 24a and 24b, and the number of the first inert gas ejection holes 24c and 24d may be equal to the number of wafers 10 held in the boat 11, respectively. The process gas ejection holes 24a and 24b, and the first inert gas ejection holes 24c and 24d may be disposed to face gaps formed between the upper and lower neighboring wafers 10 held in the boat 11. The sizes of the process gas ejection holes 24a and 24b, and the sizes of the first inert gas ejection holes 24c and 24d may be different so as to supply gas to the wafers 10 uniformly. The process gas ejection holes 24a and 24b, and the first inert gas ejection holes 24c and 24d may be provided in a manner such that a process gas ejection hole 24a, a process gas ejection hole 24b, a first inert gas ejection hole 24c, and a first inert gas ejection hole 24d are formed for a plurality of wafers 10 (for example, each hole for several wafers 10). In addition, the numbers of the respective second inert gas ejection holes 31c, 31d, 32c, and 32d may be two or more as shown in FIG. 1 and FIG. 13, or may be one.

At a part of the sidewall of the inner tube 2 opposite to the process gas supply nozzles 22a and 22b, that is, at a position opposite to or 180 degrees apart from the auxiliary chamber 21, the exhaust opening 25 such as a slit-shaped penetration hole is formed in a vertical direction with a slender and long shape. The inside of the process chamber 4 is connected to the exhaust passage 8 through the exhaust opening 25. Therefore, a process gas supplied to the process chamber 4 through the process gas ejection holes 24a and 24b of the process gas supply nozzles 22a and 22b, and an inert gas supplied to the process chamber 4 through the first inert gas ejection holes 24c and 24d of the inert gas supply nozzles 22c and 22d can be discharged to the outside of the process furnace 202 through the exhaust opening 25, the exhaust passage 8, the exhaust port 7, and the exhaust pipe 7a. Instead of forming the exhaust opening 25 in a slit-shaped penetration hole shape, a plurality of exhaust holes may be formed.

A first imaginary line from the process gas supply nozzle 22a to the exhaust opening 25, and a first imaginary line from the process gas supply nozzle 22b to the exhaust opening 25 pass across approximately the center of a wafer 10. The directions of the process gas ejection holes 24a and 24b are approximately parallel with the first imaginary lines. In addition, a second imaginary line from the inert gas supply nozzle 22c to the exhaust opening 25, and a third imaginary line from the inert gas supply nozzle 22d to the exhaust opening 25 are disposed at both sides of the first imaginary lines. The first inert gas ejection holes 24c and 24d may be pointed outward from the imaginary lines or substantially parallel with the imaginary lines. That is, the first inert gas ejection holes 24c may be pointed outward from the second imaginary line or substantially parallel with the second imaginary line. In addition, the first inert gas ejection holes 24d may be pointed outward from the third imaginary line or substantially parallel with the third imaginary line. In addition, the second inert gas ejection holes 31c, 31d, 32c, and 32d are pointed toward the centerline of wafers 10.

Owing to this structure, when a process gas and an inert gas are simultaneously supplied to the inside of the process chamber 4, as shown in FIG. 3, gas streams 30a and 30b of the process gas supplied to the inside of the process chamber 4 through the process gas ejection holes 24a and 24b are interposed between both-side gas streams 30c and 30d of the inert gas supplied to the inside of the process chamber 4 through the first inert gas ejection holes 24c and 24d, and thus the passages of the gas streams 30a and 30b are restricted. For example, if an inert gas is supplied to a gap between the circumferences of wafers 10 and the process chamber 4, the pressure of a related region increases as compared with pressures of other regions, and thus a process gas can be prevented from flowing to the gap between the circumferences of the wafers 10 and the process chamber 4. As a result, supply of a process gas to the center regions of the wafers 10 can be facilitated, and thus the supplied amount of the process gas can be more uniform throughout the circumference and center regions of each wafer 10. In addition, since a process gas supplied to the gap between the circumferences of the wafers 10 and the process chamber 4 is diluted with an inert gas, the thickness of films formed on the circumferential regions of the wafers 10 may not be excessively thickened.

In addition, when a process gas and an inert gas are simultaneously supplied to the inside of the process chamber 4, as shown in FIG. 1, gas streams 30a and 30b of the process gas supplied to the inside of the process chamber 4 through the process gas ejection holes 24a and 24b are interposed between upper and lower gas streams 33c, 33d, 34c, and 34d of the inert gas supplied to the inside of the process chamber 4 through the second inert gas ejection holes 31c, 31d, 32c, and 32d, and thus the passages of the gas streams 30a and 30b are restricted. For example, if an inert gas is supplied to a region higher or lower than stacked wafers 10, the pressure of the region increases as compared with pressures of other regions, and thus a process gas can be prevented from flowing to the region. As a result, supply of a process gas to the center regions of the wafers 10 can be facilitated so as to prevent a decrease of a film-forming rate and improve the film-forming uniformity in the surface of each wafer 10 or between the wafers 10. In addition, since a process gas can be restrained from flowing to a region higher or lower than the stacked wafers 10, formation of a thin film that causes contaminants can be prevented.

(Controller)

The gas supply/flowrate control unit 235, the pressure control unit 236, the driving control unit 237, and the temperature control unit 238 constitute a manipulation unit and an input/out unit, and are electrically connected to a main control unit 239 configured to control the overall operation of the substrate processing apparatus 101. The gas supply/flowrate control unit 235, the pressure control unit 236, the driving control unit 237, the temperature control unit 238, and the main control unit 239 constitute a controller 240.

(4) Substrate Processing Process

Figure 5:
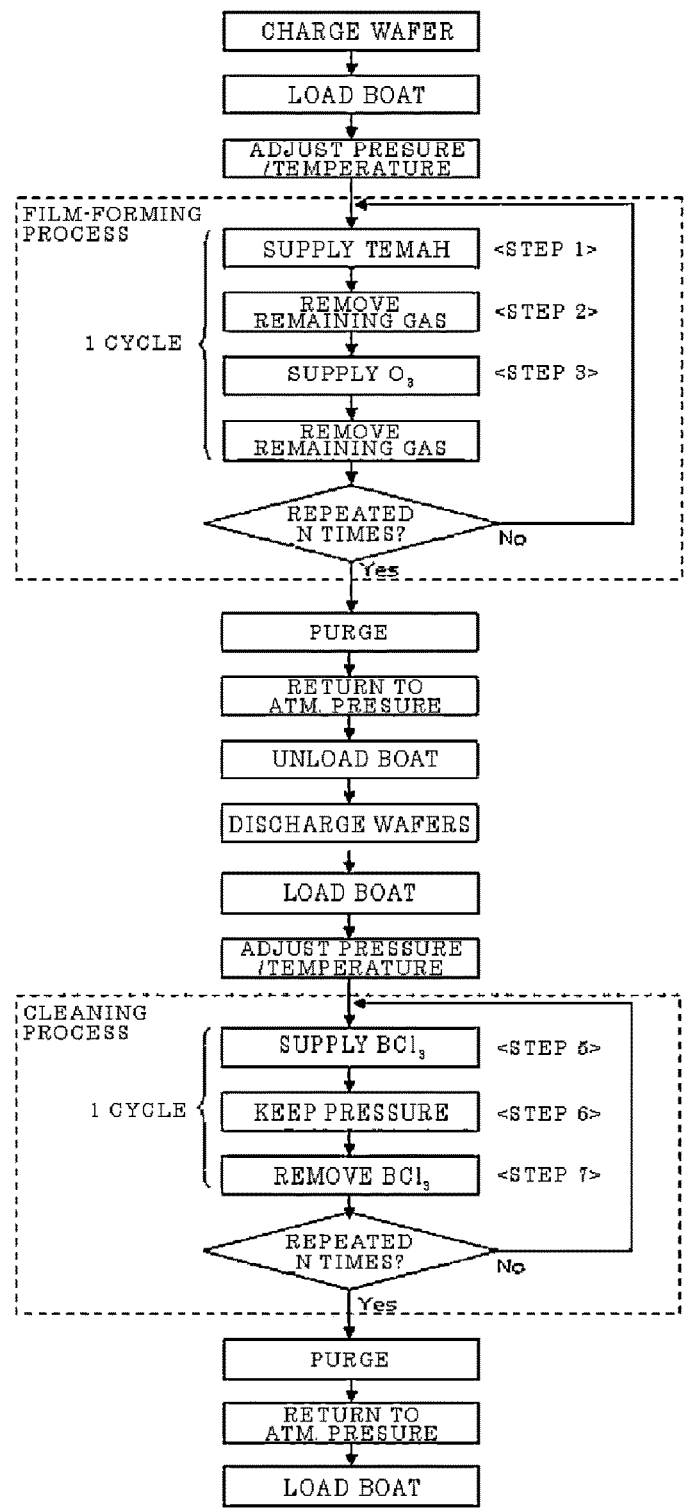
FIG. 5 is a flowchart for explaining a process flow according to an embodiment of the present invention.

Next, with reference to FIG. 5, an explanation will be given on one of semiconductor device manufacturing processes performed by the substrate processing apparatus 101. As described above, a gas having a thermal decomposition temperature lower than a process temperature (film-forming temperature), such as a gas obtained by vaporizing TEMAH, TEMAZ, or TMA (TEMAH, TEMAZ, or TMA gas), may be used as a process gas to be supplied among left, right, upper, and lower inert gas streams. In the following description, each part of the substrate processing apparatus 101 is controlled by the controller 240.

In a conventional chemical vapor deposition (CVD) or atomic layer deposition (ALD) method, for example, in a CVD method, a plurality of kinds of gases containing a plurality of elements constituting a film to be formed are simultaneously supplied, and in an ALD method, a plurality of kinds of gases containing a plurality of elements constituting a film to be formed are alternately supplied. Then, by controlling process conditions such as flowrate of gas supply, gas supply time, and plasma power in the case of using plasma excitation, a film such as hafnium oxide (HfO) film can be formed. In such a technique, for example, in the case of forming a HfO film, process conditions are controlled so that the HfO film can have a stoichiometric composition ratio (O/H≈2).

Alternatively, supply conditions may be controlled so that a film having a composition ratio different from a stoichiometric composition ratio can be formed. That is, supply conditions may be controlled so that at least one of a plurality of elements constituting a film to be formed can be stoichiometrically excessive with respect to other elements. In this way, a film can be formed while controlling the ratio of a plurality of elements constituting the film, that is, the composition ratio of the film. In the following description, an explanation will be given on an exemplary case of forming a $HfO_2$ film by an ALD method using TEMAH gas and $O_3$ gas as process gases.

In an ALD method which is a kind of CVD method, at least two kinds of film-forming process gases that react with each other are alternately supplied to a substrate under predetermined film-forming conditions (temperature, time, etc.), and the process gases are adsorbed on the substrate on an atomic layer basis to form a film by a surface reaction. In this time, the thickness of the film is controlled by adjusting the number of process gas supply cycles (for example, if the film-forming rate is 1 Å/cycle and it is intended to form a 20-Å film, the process is repeated for twenty cycles).

For example, in the case where a $HfO_2$ film is formed by an ALD method, high-quality film forming is possible in a low temperature range from 180° C. to 250° C. by using TEMAH (tetrakis ethy methyl amino hafnium, Hf[N(CH$_3$) (C$_2$H$_5$)]$_4$) gas and O$_3$ gas.

First, as described above, a group of wafers 10 to be processed is charged into the boat 11, and the boat 11 is loaded into the process chamber 4. After the boat 11 is loaded into the process chamber 4, if the inside pressure of the process chamber 4 becomes in the range from 10 Pa to 1000 Pa, for example, 50 Pa, and the inside temperature of the process chamber 4 becomes in the range from 180° C. to 250° C., for example, 220° C., the cycle of the following four steps (steps 1 to 4) is performed predetermined times. While the following steps 1 to 4 are performed, the rotary mechanism 254 may be rotated so as to keep uniform the flowrate of gas supplied to the wafers 10.

(Step 1)

Both the on-off valve 26a of the process gas supply pipe 25a and the APC valve 7b of the exhaust pipe 7a are opened, and while exhausting the inside of the process chamber 4 by using the vacuum pump 7c, a process gas such as TEMAH gas is supplied to the inside of the process chamber 4 through the process gas ejection holes 24a of the process gas supply nozzle 22a. At this time, the TEMAH gas is supplied after being diluted with a carrier gas (N$_2$ gas) supplied through the carrier gas supply pipe (not shown).

TEMAH gas largely affects the in-surface uniformity in a substrate processing process (the in-surface thickness uniformity of a HfO$_2$ film formed on a surface of a wafer 10). Therefore, in step 1 of the current embodiment, when TEMAH gas is supplied to the inside of the process chamber 4, the on-off valves 26c and 26d of the inert gas supply pipes 25c and 25d are simultaneously opened so as to supply N$_2$ gas as an inert gas to the inside of the process chamber 4 through the first inert gas ejection holes 24c and 24d and the second inert gas ejection holes 31c, 31d, 32c, and 32d of the inert gas supply nozzles 22c and 22d.

As described above, as shown in FIG. 3, TEMAH gas supplied to the inside of the process chamber 4 through the process gas ejection holes 24a of the process gas supply nozzle 22a is enclosed at both sides by N$_2$ gas supplied to the inside of the process chamber 4 through the first inert gas ejection holes 24c and 24d, and thus the flow passage of the TEMAH gas is restricted. For example, if N$_2$ gas is supplied to a gap between the circumferences of the wafers 10 and the process chamber 4, the pressure of a related region increases as compared with pressures of other regions, and thus TEMAH gas can be prevented from flowing (escaping) to the gap between the circumferences of the wafers 10 and the process chamber 4. As a result, supply of TEMAH gas to the center regions of the wafers 10 can be facilitated, and thus the supplied amount of the TEMAH gas can be more uniform throughout the circumference and center regions of each wafer 10. In addition, since TEMAH gas supplied to the gap between the circumferences of the wafers 10 and the process chamber 4 is diluted with N$_2$ gas, the thickness of films formed on the circumferential regions of the wafers 10 may not be excessively thickened.

In addition, as shown in FIG. 1, TEMAH gas supplied to the inside of the process chamber 4 through the process gas ejection holes 24a of the process gas supply nozzle 22a is enclosed at upper and lower sides by N$_2$ gas supplied to the inside of the process chamber 4 through the second inert gas ejection holes 31c, 31d, 32c, and 32d, and thus the flow passage of the TEMAH gas is restricted. For example, if N$_2$ gas is supplied to a region higher or lower than the stacked wafers 10, the pressure of the region increases as compared with pressures of other regions, and thus TEMAH gas can be prevented from flowing (escaping) to the region. As a result, supply of TEMAH gas to a region where the wafers 10 are stacked (the center regions of the wafers 10) can be facilitated so as to prevent a decrease of a film-forming rate and improve the film-forming uniformity in the surface of each wafer 10 or between the wafers 10. In addition, since TEMAH gas can be restrained from flowing to a region higher or lower than the stacked wafers 10, formation of a thin film that causes contaminants can be prevented.

As described above, in step 1, an inert gas (N$_2$ gas) supplied through the inert gas supply pipes 25c and 25d functions as an assistant gas that restricts the passage of a process gas for making uniform the amount of process gas supplied to the wafers 10.

Preferably, when TEMAH gas is supplied through the process gas supply nozzle 22a, N$_2$ gas may be supplied through the inert gas supply nozzles 22c and 22d toward both sides of the TEMAH gas supplied through the process gas supply nozzle 22a at flowrates equal to or greater than the flowrate of the TEMAH gas supplied through the process gas supply nozzle 22a. That is, preferably, each of the flowrate of N$_2$ gas supplied through the first inert gas ejection holes 24c of the inert gas supply nozzle 22c and the flowrate of N$_2$ gas supplied through the first inert gas ejection holes 24d of the inert gas supply nozzle 22d may be equal to or greater than the flowrate of TEMAH gas supplied through the process gas ejection holes 24a of the process gas supply nozzle 22a. The flowrate of TEMAH gas and the flowrate of N$_2$ gas are respectively controlled by the MFCs 27a, 27c, and 27d. As a result, supply of TEMAH gas to the center regions of the wafers 10 is further facilitated. In addition, at the gap between the circumferences of the wafers 10 and the process chamber 4, dilution of TEMAH gas with N$_2$ gas can be further facilitated. Furthermore, similarly, the flowrates of N$_2$ gas supplied through the second inert gas ejection holes 31c, 31d, 32c, and 32d may be equal to or greater than the flowrate of TEMAH gas supplied through the process gas ejection holes 24a of the process gas supply nozzle 22a, respectively.

In step 1, the inside pressure of the process chamber 4 is adjusted in the range from 20 Pa to 900 Pa, for example, 50 Pa. In addition, the supply flowrate of TEMAH gas through the process gas supply nozzle 22a is adjusted in the range from 0.01 g/min to 0.35 g/min, for example, 0.3 g/min. The supply flowrate of N$_2$ gas (carrier gas) through the carrier gas supply pipe (not shown) connected to the process gas supply pipe 25a is adjusted in the range from 0.1 slm to 0.5 slm, for example, 1.0 slm. The supply flowrates of N$_2$ gas (assistant gas) through the inert gas supply nozzles 22c and 22d (the sum of supply flowrates through the first inert gas ejection holes 24c and the second inert gas ejection holes 31c and 31d, and the sum of supply flowrates through the first inert gas ejection holes 24d and the second inert gas ejection holes 32c and 32d) may be adjusted in the range from 20 slm to 30 slm, for example, 30 slm, respectively. In addition, the inside temperature of the process chamber 4 is adjusted in the range from 180° C. to 250° C., for example, 220° C. In addition, the wafers 10 are exposed to TEMAH gas for 30 seconds to 180 seconds, for example, 120 seconds (the execution time of step 1).

When TEMAH gas is supplied to the inside of the process chamber 4, molecules of the TEMAH gas participate in surface reaction (chemical adsorption) with surface parts such as under-layer films of the wafers 10.

(Step 2)

The on-off valve 26a of the process gas supply pipe 25a is closed to interrupt supply of TEMAH gas to the process chamber 4. At this time, the APC valve 7b of the exhaust pipe 7a is kept open, and the inside of the process chamber 4 is exhausted to 20 Pa or lower by using the vacuum pump 7c so as to remove remaining TEMAH gas from the inside of the process chamber 4. In addition, if $N_2$ gas is supplied to the inside of the process chamber 4 by opening the on-off valves 26c and 26d of the inert gas supply pipes 25c and 25d, the remaining TEMAH gas can be more effectively removed from the inside of the process chamber 4. In step 2, $N_2$ gas supplied through the inert gas supply pipes 25c and 25d functions as a purge gas that facilitates exhaustion of remaining gas from the process chamber 4.

In step 2, the inside pressure of the process chamber 4 is adjusted to 20 Pa or lower, for example. In addition, the supply flowrates of $N_2$ gas (purge gas) through the inert gas supply nozzles 22c and 22d (the sum of supply flowrates through the first inert gas ejection holes 24c and the second inert gas ejection holes 31c and 31d, and the sum of supply flowrates through the first inert gas ejection holes 24d and the second inert gas ejection holes 32c and 32d) may be adjusted in the range from 0.5 slm to 20 slm, for example, 12 slm, respectively. In addition, the inside temperature of the process chamber 4 is adjusted in the range from 180° C. to 250° C., for example, 220° C. In addition, the execution time of step 2 is 30 seconds to 150 seconds, for example, 60 seconds.

(Step 3)

In a state where the APC valve 7b of the exhaust pipe 7a is opened, the on-off valve 26b of the process gas supply pipe 25b is opened so as to supply a process gas such as $O_3$ gas to the inside of the process chamber 4 through the process gas ejection holes 24b of the process gas supply nozzle 22b while exhausting the inside of the process chamber 4 by using the vacuum pump 7c. At this time, the $O_3$ gas is supplied after being diluted with a carrier gas ($N_2$ gas) supplied through the carrier gas supply pipe (not shown).

$O_3$ gas does not largely affect the in-surface uniformity in a substrate processing process (the in-surface thickness uniformity of a $HfO_2$ film formed on a surface of a wafer 10). Therefore, in step 3 of the current embodiment, $N_2$ gas (assistant gas) is not supplied through the inert gas supply nozzles 22c and 22d. However, if a process gas that affects the in-surface uniformity of a substrate processing process is supplied in step 3, it is preferable that $N_2$ gas (assistant gas) be supplied through the inert gas supply nozzles 22c and 22d in step 3 like in the case of step 1. Alternatively, although $O_3$ gas is supplied, $N_2$ gas (assistant gas) may be supplied through the inert gas supply nozzles 22c and 22d.

In step 3, the inside pressure of the process chamber 4 is adjusted in the range from 20 Pa to 900 Pa, for example, 50 Pa. In addition, the supply flowrate of $O_3$ gas through the process gas supply nozzle 22b is adjusted in the range from 6 slm to 20 slm, for example, 17 slm.

The supply flowrate of $N_2$ gas (carrier gas) through the carrier gas supply pipe (not shown) connected to the process gas supply pipe 25b is adjusted in the range from 0 slm to 2 slm, for example, 0.5 slm. In addition, the inside temperature of the process chamber 4 is adjusted in the range from 180° C. to 250° C., for example, 220° C. In addition, the wafers 10 are exposed to $O_3$ gas for 10 seconds to 300 seconds, for example, 40 seconds (the execution time of step 3).

When $O_3$ gas is supplied to the inside of the process chamber 4, the $O_3$ gas participates in surface reaction with the TEMAH gas adsorbed in the surfaces of the wafers 10, thereby forming $HfO_2$ films on the wafers 10.

(Step 4)

The on-off valve 26b of the process gas supply pipe 25b is closed to interrupt supply of $O_3$ gas to the process chamber 4. At this time, the APC valve 7b of the exhaust pipe 7a is kept open, and the inside of the process chamber 4 is exhausted to 20 Pa or lower by using the vacuum pump 7c so as to remove remaining $O_3$ gas from the inside of the process chamber 4. In addition, if $N_2$ gas is supplied to the inside of the process chamber 4 by opening the on-off valves 26c and 26d of the inert gas supply pipes 25c and 25d, the remaining TEMAH gas can be more effectively removed from the inside of the process chamber 4. In step 4, $N_2$ gas supplied through the inert gas supply pipes 25c and 25d functions as a purge gas that facilitates exhaustion of remaining gas from the process chamber 4.

In step 4, the inside pressure of the process chamber 4 is adjusted to 20 Pa or lower, for example. In addition, the supply flowrates of $N_2$ gas (purge gas) through the inert gas supply nozzles 22c and 22d (the sum of supply flowrates through the first inert gas ejection holes 24c and the second inert gas ejection holes 31c and 31d, and the sum of supply flowrates through the first inert gas ejection holes 24d and the second inert gas ejection holes 32c and 32d) may be adjusted in the range from 0.5 slm to 20 slm, for example, 12 slm, respectively. In addition, the inside temperature of the process chamber 4 is adjusted in the range from 180° C. to 250° C., for example, 220° C. In addition, the execution time of step 4 is 30 seconds to 150 seconds, for example, 60 seconds.

The cycle of steps 1 to 4 is repeated a plurality of times to form $HfO_2$ films on the wafers 10 to a predetermined thickness. Thereafter, the boat 11 in which the group of wafers 10 are held is unloaded from the process chamber 4, and in this way, the film-forming process of the current embodiment is terminated.

Figure 6:
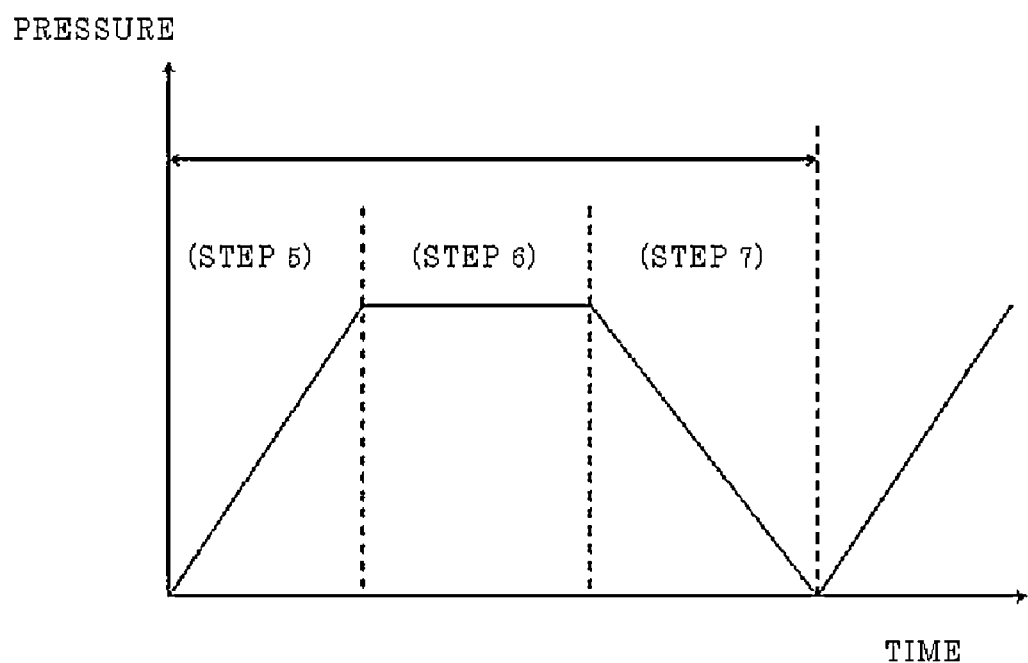
FIG. 6 is a view illustrating a cleaning process according to an embodiment of the present invention.

Next, a cleaning process is performed to remove a $HfO_2$ film attached to parts such as the process chamber 4 and the boat 11. In the cleaning process, gas such as boron trichloride ($BCl_3$) gas can be used as an etching gas to remove (etch) a film, and this example will now be explained with reference to FIG. 5 and FIG. 6. The boat 11 is loaded into the process chamber 4 and the inside pressure of the process chamber 4 is set to a predetermined pressure value, and if the inside temperature of the process chamber 4 becomes to a predetermined temperature in the range from 400° C. to 600° C., the cleaning process is started. First, $BCl_3$ gas is supplied to the inside of the process chamber 4 (step 5) until the pressure of the process chamber 4 increases to a predetermined value, and the process chamber 4 is kept at the predetermined pressure value for a predetermined time (step 6). At this time, $BCl_3$ gas may be continuously supplied to the inside of the process chamber 4, or supply of $BCl_3$ gas and exhaustion of the process chamber 4 may be irregularly (intermittently) performed by turns. After the predetermined time, the inside of the process chamber 4 is vacuum-evacuated and purged with an inert gas such as $N_2$ gas (step 7).

The cycle of steps 5 to 7 is repeated a predetermined times, and in this way, the cleaning process is performed by cyclic etching. In this way, during the cleaning process, exhaustion is irregularly (intermittently) repeated a predetermined times. In the case where the cleaning process is preformed by cyclic etching, by checking the amount of etched material per cycle, the total amount of etched material can be controlled by adjusting the number of etching cycles. Moreover, in this case, consumption of etching gas can be reduced as compared with a cleaning method of producing a continuous flow of etching gas.

BCl$_3$ gas introduced into the process chamber 4 is diffused throughout the process chamber 4 and thus makes contact with deposited substances including a HfO$_2$ film attached to the process chamber 4. Then, thermal chemical reaction occurs between the BCl$_3$ gas and the deposited substances to generate reaction products. The reaction products are discharged to the outside of the process chamber 4 through the exhaust pipe 7a. In this way, deposited substances are removed (etched), and the inside of the process chamber 4 is cleaned.

After the inside of the process chamber 4 is cleaned, the film-forming process is performed again on the next wafers 10. That is, the boat 11 in which wafers 10 are charged is loaded into the process chamber 4, and steps 1 to 4 are repeated to form films on the wafers 10. Thereafter, the boat 11 charged with the processed wafers 10 is unloaded from the process chamber 4. Then, if necessary, a cleaning process is performed on the inside of the process chamber 4. At this time, only BCl$_3$ gas may be supplied as an etching gas, or other gases such as O$_3$ gas may be added to the BCl$_3$ gas.

(5) Effects of Current Embodiment

According to the current embodiment, one or more of the following effects can be attained.

(a) According to the current embodiment, in step 1, TEMAH gas supplied to the inside of the process chamber 4 through the process gas ejection holes 24a of the process gas supply nozzle 22a is enclosed at upper and lower sides by N$_2$ gas supplied to the inside of the process chamber 4 through the second inert gas ejection holes 31c, 31d, 32c, and 32d, and thus the flow passage of the TEMAH gas is restricted. For example, if N$_2$ gas is supplied to a region higher or lower than stacked wafers 10, the pressure of the region increases as compared with pressures of other regions, and thus TEMAH gas can be prevented from flowing (escaping) to the region. As a result, supply of TEMAH gas to a region where the wafers 10 are stacked (the center regions of the wafers 10) can be facilitated so as to prevent a decrease of a film-forming rate and improve the film-forming uniformity in the surface of each wafer 10 or between the wafers 10. In addition, since TEMAH gas can be restrained from flowing to a region higher or lower than the stacked wafers 10, formation of a thin film that causes contaminants can be prevented.

Figure 12:
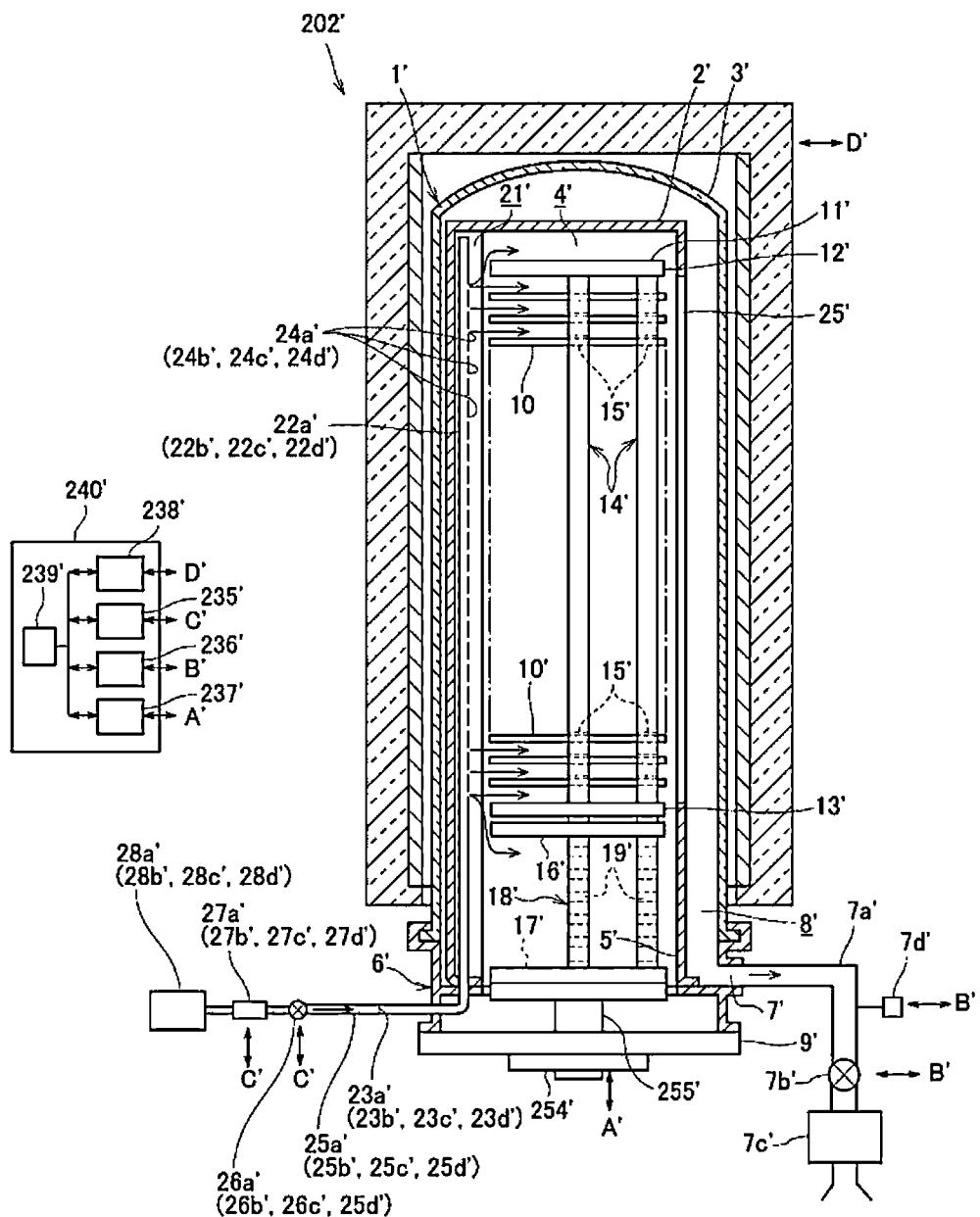
FIG. 12 is a schematic view illustrating flows of a process gas in a process furnace where second inert gas injection holes are not formed.
Figure 14:
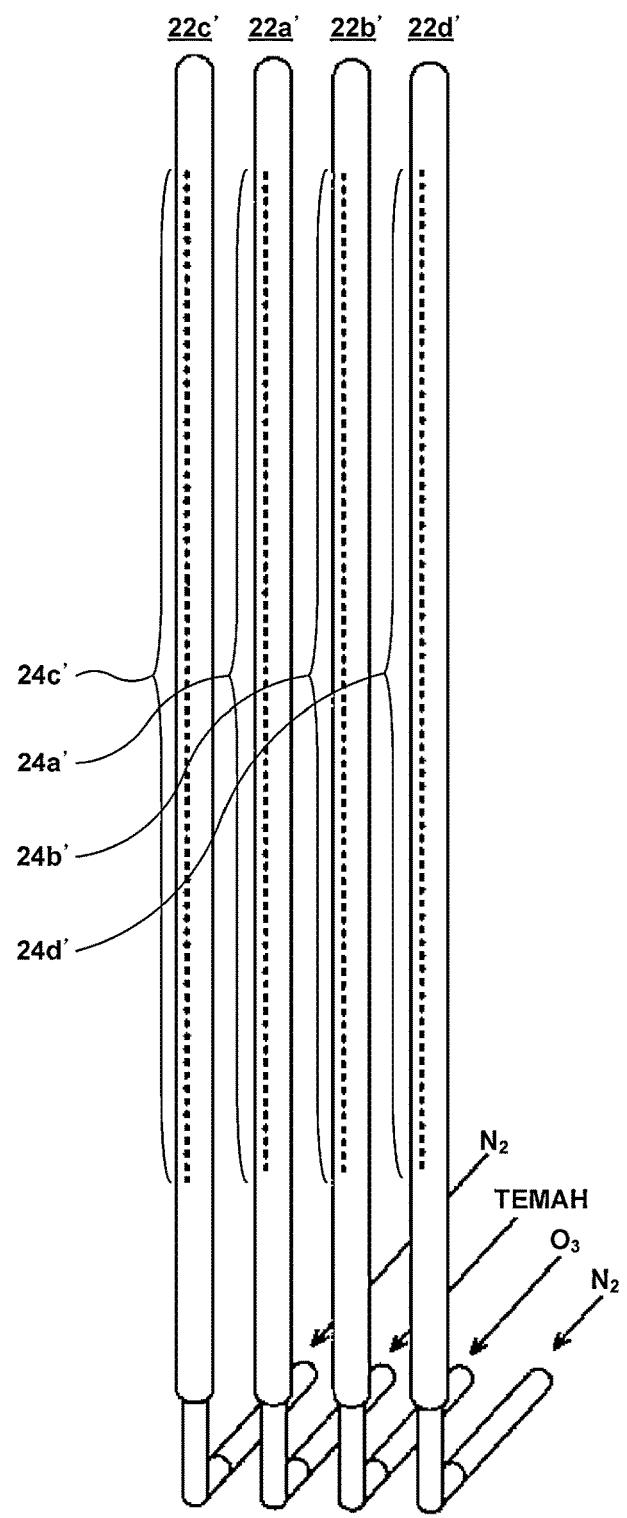
FIG. 14 is a schematic view illustrating inert gas supply nozzles in which second inert gas supply holes are not installed, and process gas supply nozzles.

For reference, FIG. 14 is a schematic view illustrating inert gas supply nozzles 22c' and 22d' in which second inert gas supply holes are not installed, and process gas supply nozzles 22a and 22b'. In this case, flows of process gas in a process chamber are illustrated in FIG. 12. That is, a process gas supplied to the inside of a process chamber 4' can flow to a region where wafers 10 are not stacked (a region higher or lower than a region where wafers 10 are stacked) instead of flowing between the wafers 10. As a result, the amount of process gas supplied to the wafers 10 is decreased to lower the film-forming rate or film-forming uniformity in the surface of each wafer 10 or between the wafers 10. Furthermore, the process gas is attached to a part such as an inner wall of the process chamber 4' in a region where the wafers 10 are not stacked, and thus a thin film causing contaminants is formed. Particularly, if the inner wall of the process chamber 4' in the region where the wafers 10 are not stacked is kept at a low temperature, a film may be more easily formed but a film once formed may not be easily removed although a cleaning (dry cleaning) process is performed. However, according to the current embodiment, when a process gas is supplied to the inside of the process chamber 4, an inert gas is simultaneously supplied to a region where wafers 10 are not stacked, and thus the above-described problems can be effectively solved.

(b) According to the current embodiment, in step 1, TEMAH gas supplied to the inside of the process chamber 4 through the process gas ejection holes 24a of the process gas supply nozzle 22a is enclosed at both sides by N$_2$ gas supplied to the inside of the process chamber 4 through the first inert gas ejection holes 24c and 24d of the inert gas supply nozzles 22c and 22d, and thus the flow passage of the TEMAH gas is restricted. For example, if N$_2$ gas is supplied to a gap between the circumferences of wafers 10 and the process chamber 4, the pressure of a related region increases as compared with pressures of other regions, and thus TEMAH gas can be prevented from flowing to the gap between the circumferences of the wafers 10 and the process chamber 4. As a result, supply of TEMAH gas to the center regions of the wafers 10 can be facilitated, and thus the supplied amount of the TEMAH gas can be more uniform throughout the circumference and center regions of each wafer 10. In addition, since TEMAH gas supplied to the gap between the circumferences of the wafers 10 and the process chamber 4 is diluted with N$_2$ gas, the thickness of films formed on the circumferential regions of the wafers 10 may not be excessively thickened.

(c) In the current embodiment, when TEMAH gas is supplied through the process gas supply nozzle 22a, the flowrates of N$_2$ gas supplied through the inert gas supply nozzles 22c and 22d toward both sides of the TEMAH gas supplied through the process gas supply nozzle 22a may be adjusted to be equal to or greater than the flowrate of the TEMAH gas supplied through the process gas supply nozzle 22a. That is, each of the flowrate of N$_2$ gas supplied through the first inert gas ejection holes 24c of the inert gas supply nozzle 22c and the flowrate of N$_2$ gas supplied through the first inert gas ejection holes 24d of the inert gas supply nozzle 22d may be adjusted to be equal to or greater than the flowrate of TEMAH gas supplied through the process gas ejection holes 24a of the process gas supply nozzle 22a. In this case, supply of TEMAH gas to the center regions of wafers 10 can be further facilitated. In addition, at a gap between the circumferences of the wafers 10 and the process chamber 4, dilution of TEMAH gas with N$_2$ gas may be further facilitated, and thus the thickness of films formed on the circumferential regions of the wafers 10 may not be excessively thickened.

(d) In the current embodiment, the flowrates of N$_2$ gas supplied through the second inert gas ejection holes 31c, 31d, 32c, and 32d may be adjusted to be equal to or greater than the flowrate of TEMAH gas supplied through the process gas ejection holes 24a of the process gas supply nozzle 22a, respectively, so as to further facilitate supply of TEMAH gas a region where the wafers 10 are stacked (the center regions of the wafers 10) for preventing a decrease of a film-forming rate and improving the film-forming uniformity in the surface of each wafer 10 or between the wafers 10. In addition, since TEMAH gas can be restrained from flowing to a region higher or lower than the stacked wafers 10, formation of a thin film that causes contaminants can be prevented.

(e) According to the current embodiment, since O$_3$ gas has small influence on the in-surface thickness uniformity of a HfO$_2$ film formed on a surface of a wafer 10, in step 3, N$_2$ gas (assistant gas) is not supplied through the inert gas supply nozzles 22c and 22d.

However, in step 3, N₂ gas (assistant gas) may be supplied through the inert gas supply nozzles 22c and 22d like in the case of step 1.

In this case, O₃ gas supplied to the inside of the process chamber 4 through the process gas ejection holes 24b of the process gas supply nozzle 22b is enclosed at both sides by N₂ gas supplied to the inside of the process chamber 4 through the first inert gas ejection holes 24c and 24d, and thus the flow passage of the O₃ gas is restricted. For example, if N₂ gas is supplied to a gap between the circumferences of wafers 10 and the process chamber 4, the pressure of a related region increases as compared with pressures of other regions, and thus O₃ gas can be prevented from flowing to the gap between the circumferences of the wafers 10 and the process chamber 4. As a result, supply of O₃ gas to the center regions of the wafers 10 can be facilitated, and thus the supplied amount of the O₃ gas can be more uniform throughout the circumference and center regions of each wafer 10. In addition, since O₃ gas supplied to the gap between the circumferences of the wafers 10 and the process chamber 4 is diluted with N₂ gas, the thickness of films formed on the circumferential regions of the wafers 10 may not be excessively thickened.

(f) In the current embodiment, when O₃ gas is supplied through the process gas supply nozzle 22b, the flowrates of N₂ gas supplied through the inert gas supply nozzles 22c and 22d may be adjusted to be equal to or greater than the flowrate of the O₃ gas supplied through the process gas supply nozzle 22b, so as to facilitate supply of O₃ gas to the center regions of wafers 10. In addition, at a gap between the circumferences of the wafers 10 and the process chamber 4, dilution of O₃ gas with N₂ gas may be further facilitated, and thus the thickness of films formed on the circumferential regions of the wafers 10 may not be excessively thickened.

(g) In steps 2 and 4 of the current embodiment, if the on-off valves 26c and 26d of the inert gas supply pipes 25c and 25d are opened to supply N₂ gas to the inside of the process chamber 4, TEMAH gas or O₃ gas remaining in the process chamber 4 can be removed from the process chamber 4 more effectively. As a result, steps 2 and 4 can be performed in shorter times, and thus the productivity of substrate processing can be increased.

(i) According to the current embodiment, from the beginning, a film is prevented from being attached to a part from which the film is not easily removed, and thus a time necessary for cleaning can be reduced. In addition, over-etching can be prevented.

(j) According to the current embodiment, no ring-shaped rectifying plate is necessary between the circumference of each wafer 10 held by the boat 11 and the inner wall of the process chamber 4. Therefore, the pitch of stacked wafers 10 is not necessary to be large, and the number of wafers that can be batch-processed is not reduced. As a result, the productivity of substrate processing can be improved.

Figure 7:
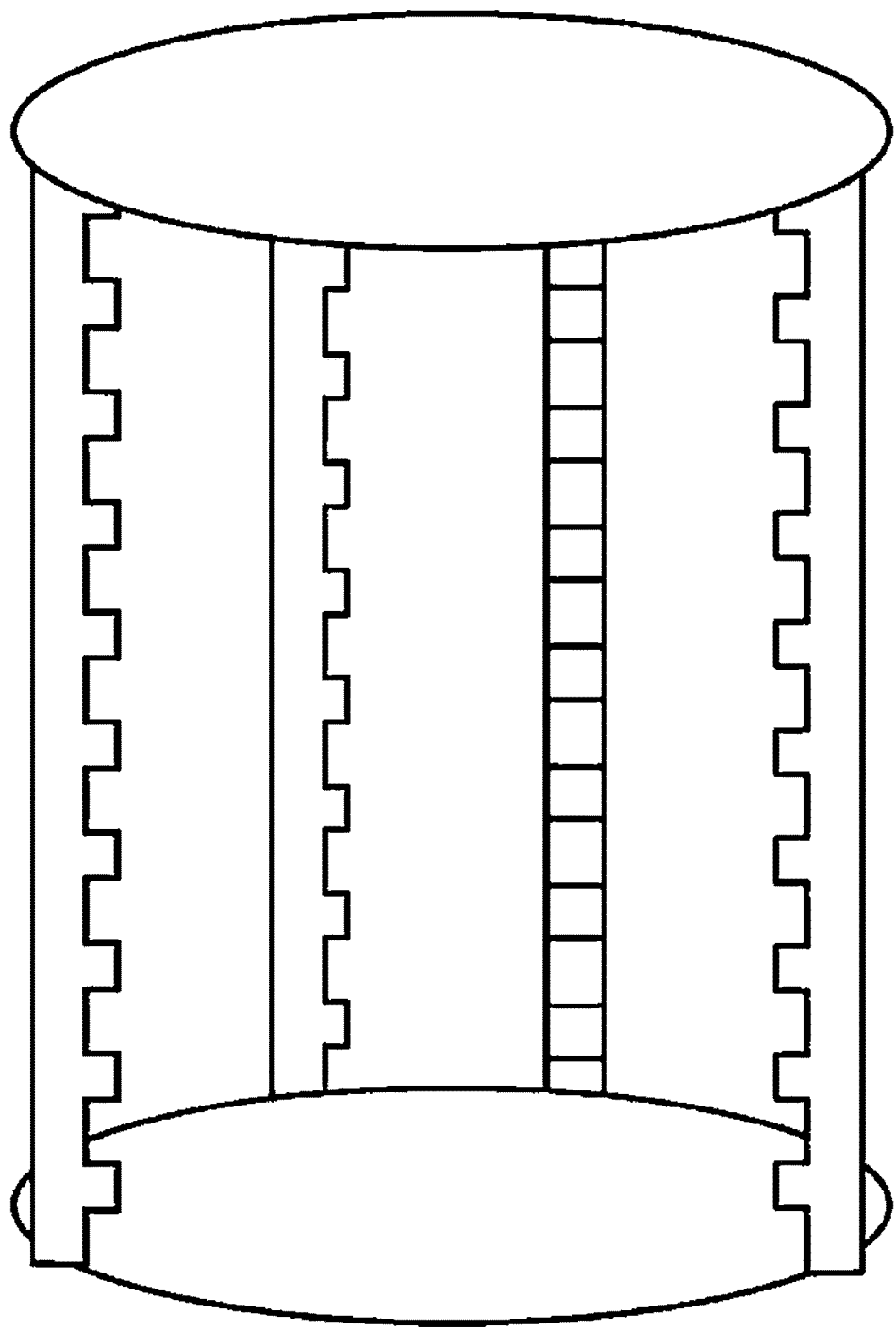
FIG. 7 is a schematic view illustrating a substrate holding tool including no rectifying plate.

In addition, the manufacturing costs of the boat 11 and substrate processing costs can be reduced. FIG. 7 is a schematic view illustrating a boat 11 including no rectifying plate.

Figure 4:
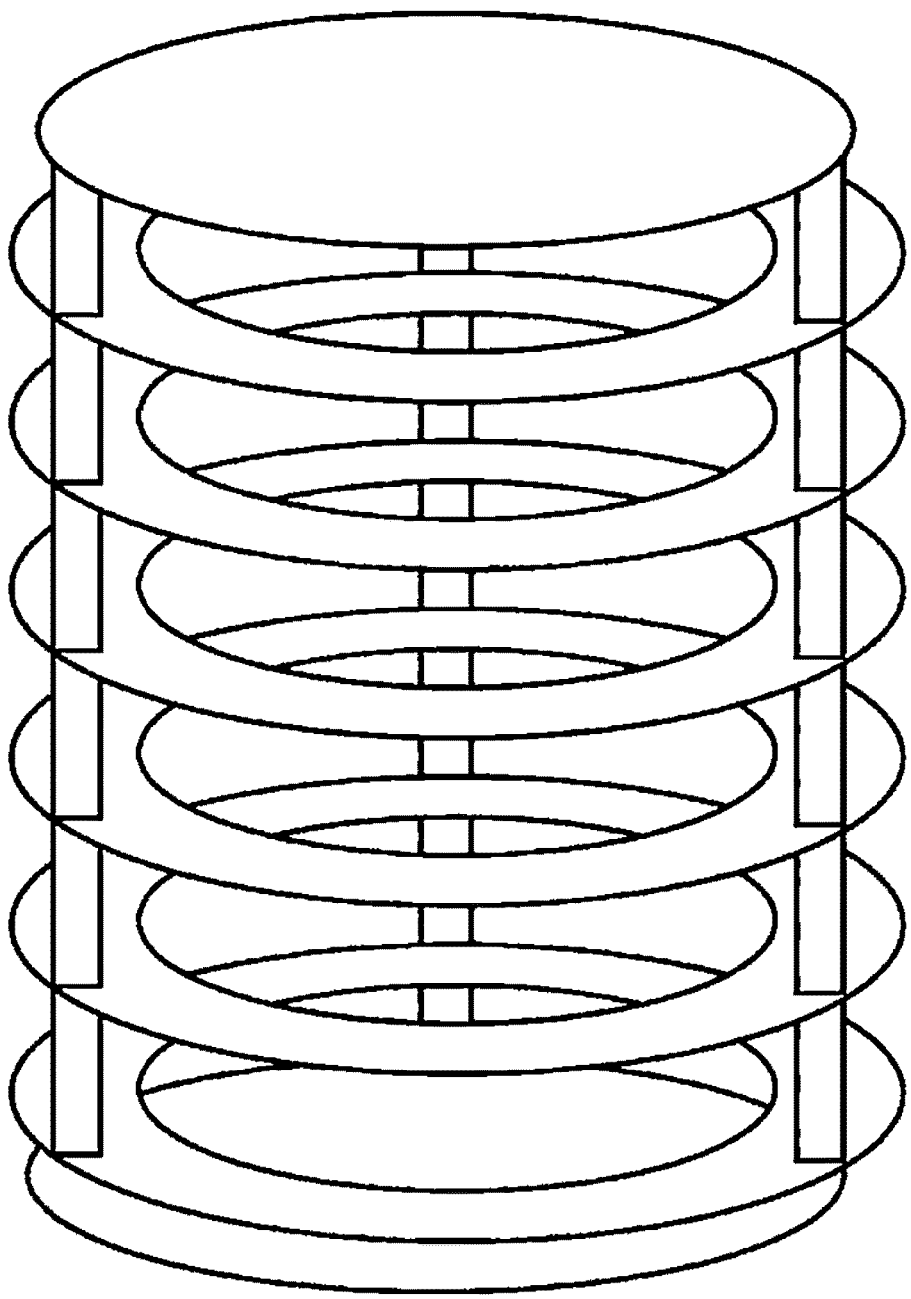
FIG. 4 is a schematic view illustrating a substrate holding tool in which ring-shaped rectifying plates are installed.

To facilitate supply of gas between neighboring wafers 10, rectifying plates may be provided between the circumferences of the wafers 10 held by the boat 11 and the inner wall of the process chamber 4. For reference, FIG. 4 is a schematic view illustrating a boat in which ring-shaped rectifying plates are installed. By providing ring-shaped rectifying plates around the circumferences of wafers 10, films may be formed on the rectifying plates by a process gas, and thus films formed on the circumferential regions of the wafers 10 can be kept thin. However, according to such a method, a substrate transfer mechanism used to charge wafers 10 into the boat may interfere with (make contact with) the rectifying plates. If the pitch of stacked wafers 10 is increased to prevent such interference, the number of wafers 10 that can be batch-processed is decreased, and thus the productivity of substrate processing may be decreased. In addition, a boat including ring-shaped rectifying plates is fragile and expensive due to its complex structure.

The second inert gas ejection holes 31c, 31d, 32c, and 32d of the inert gas supply nozzles 22c and 22d may have a hole or slit shape. If the second inert gas ejection holes 31c, 31d, 32c, and 32d are large, the supply amount of inert gas increases. Preferably, the amount of inert gas supplied through the second inert gas ejection holes 31c, 31d, 32c, and 32d may be greater than the amount of process gas supplied to wafers 10; however, the inert gas may give bad effects such as dilution of process gas to a wafer-stacked region. Thus, preferably, the second inert gas ejection holes 31c, 31d, 32c, and 32d may substantially the same size as the first inert gas ejection holes 24c and 24d formed at the wafer-stacked region. At this time, the numbers of the second inert gas ejection holes 31c, 31d, 32c, and 32d may be varied according to a desired amount of inert gas supply. For example, in the case of supplying inert gas at a relatively high flowrate, the numbers of the second inert gas ejection holes 31c, 31d, 32c, and 32d may be set to be equal so as to supply inert gas uniformly through the second inert gas ejection holes 31c, 31d, 32c, and 32d.

In the above description, the process furnace 202 is shaped in a manner such that the exhaust opening 25 is formed at a position opposite to the process gas supply nozzles 22a and 22b. In this case, since process gas and inert gas can flow to the exhaust opening 25 across the centers of wafers 10, the effects of the present invention can be improved. Alternatively, a single process tube may be used with a plurality of process gas supply nozzles having different heights and each having only one process gas ejection hole. In this case, a smaller inert gas supply nozzle may be erected at a low temperature position. At this time, the inert gas supply nozzle may have a plurality of holes.

Another Embodiment of the Invention

In the above-described embodiment, one or more process gas supply nozzles 22a and 22b are used to supply process gases to the inside of the process chamber 4, and a pair of inert gas supply nozzles 22c and 22d are disposed at both sides of the process gas supply nozzles 22a and 22b so as to supply inert gas to the inside of the process chamber 4. In this state, each of the process gas (for example, TEMAH gas) supplied through the process gas supply nozzle 22a and the process gas (for example, O₃ gas) supplied through the process gas supply nozzle 22b is enclosed at both sides by the inert gas supplied through the inert gas supply nozzles 22c and 22d.

However, the present invention is not limited to the above-described embodiment. For example, if the supply amount of only one of a plurality of process gases supplied through one ore more process gas supply nozzles has influence on the in-surface uniformity of substrate processing (that is, if the supply amount of the other of the plurality of process gases does not have notable influence on the in-surface uniformity of substrate processing), only the process gas having influence on the in-surface uniformity of substrate processing may be supplied in a state where the process gas is enclosed at both sides by inert gas, and the other process gas that does not have notable influence on the in-surface uniformity of substrate processing may be supplied in a state where the other process gas is not enclosed at both sides by inert gas.

In this case, at least one of the one or more process gas supply nozzles (which is configured to supply a process gas that does not have notable influence on the in-surface uniformity of substrate processing) may supply an inert gas when a process gas is supplied through another process gas supply nozzle (configured to supply a process gas having an influence on the in-surface uniformity of substrate processing), in a manner such that the flowrate of inert gas is equal to or greater than the flowrate of the process gas.

Figure 15:
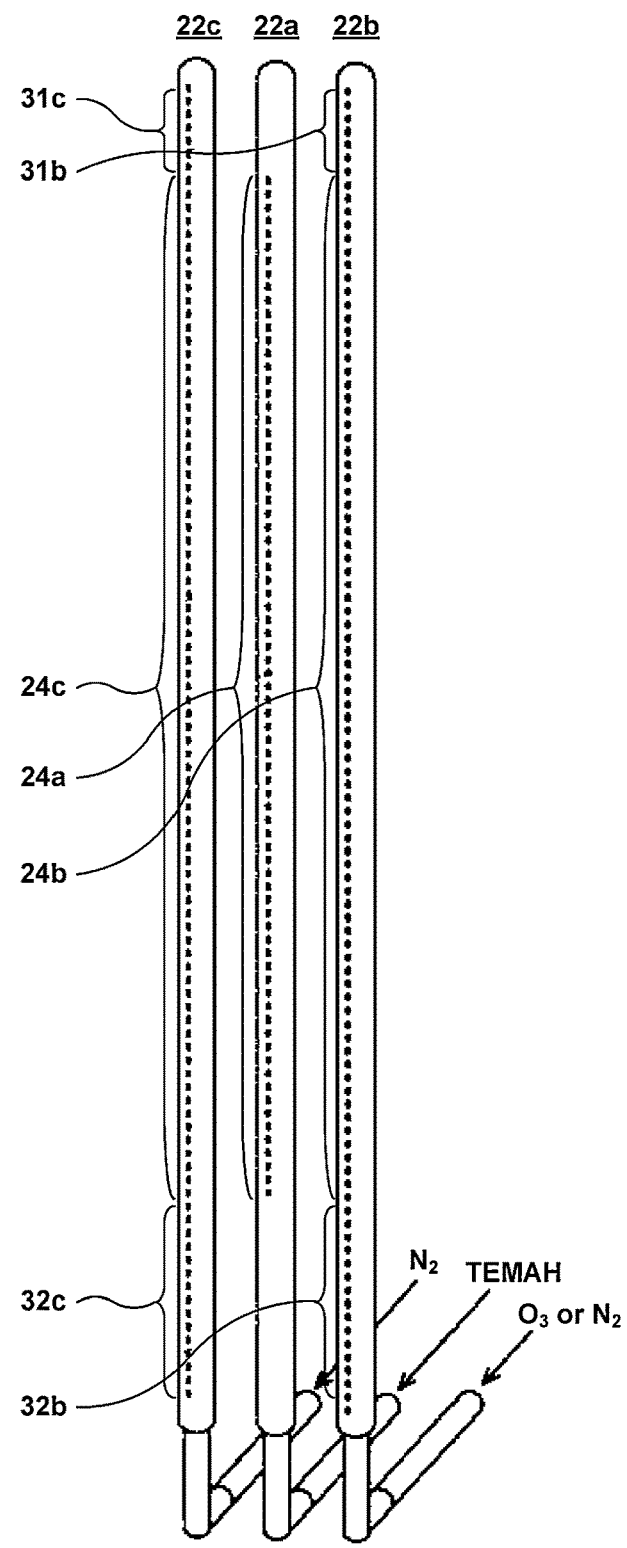
FIG. 15 is a schematic view illustrating inert gas supply nozzles and process gas supply nozzles according to another embodiment of the present invention.

For example, in the case where the supply amount of TEMAH gas has significant influence on the in-surface uniformity of substrate processing but the supply amount of $O_3$ gas does not have notable influence on the in-surface uniformity of substrate processing, as shown in FIG. 15, an inert gas supply nozzle 24d may not be used. Only TEMAH gas may be supplied in a state where the TEMAH gas is enclosed at both sides by inert gas, and $O_3$ gas may be supplied in a state where the $O_3$ gas is not enclosed at both sides by inert gas. That is, when TEMAH gas is supplied through the process gas supply nozzle 22a, both the inert gas supply nozzle 22c and the process gas supply nozzle 22b may supply $N_2$ gas at flowrates greater than the flowrate of the TEMAH gas supplied through the process gas supply nozzle 22a. In this case, TEMAH gas supplied through the process gas ejection holes 24a of the process gas supply nozzle 22a is enclosed at both sides by $N_2$ gas supplied through the first inert gas ejection holes 24c of the inert gas supply nozzle 22c and $N_2$ gas supplied through the process gas ejection holes 24b of the process gas supply nozzle 22b, and thus the flow passage of the TEMAH gas is restricted. As a result, supply of TEMAH gas to the center regions of wafers 10 can be facilitated, and thus the supplied amount of the TEMAH gas can be more uniform throughout the circumference and center regions of each wafer 10. In addition, since TEMAH gas supplied to a gap between the circumferences of the wafers 10 and the process chamber 4 is diluted with an inert gas, the thickness of films formed on the circumferential regions of the wafers 10 may not be excessively thickened.

In addition, the process gas supply nozzle 22b which is used at this time to supply an inert gas may includes at least one inert gas ejection hole disposed in a region where wafers 10 are not stacked. That is, at least one second inert gas ejection hole 31b and at least one second inert gas ejection hole 32b may be formed in the process gas supply nozzle 22b at upper and lower sides of the process gas ejection holes 24b, respectively. Owing to this, TEMAH gas supplied to the inside of the process chamber 4 through the process gas ejection holes 24a of the process gas supply nozzle 22a is enclosed at upper and lower sides by $N_2$ gas supplied through the second inert gas ejection holes 31c and 32c of the inert gas supply nozzle 22c and the second inert gas ejection holes 31b and 32b of the process gas supply nozzle 22b, and thus the flow passage of the TEMAH gas is restricted. As a result, supply of TEMAH gas to the region where the wafers 10 are stacked (the center regions of the wafers 10) can be facilitated so as to prevent a decrease of a film-forming rate and improve the film-forming uniformity in the surface of each wafer 10 or between the wafers 10. In addition, since TEMAH gas can be restrained from flowing to a region higher or lower than the region where the wafers 10 are stacked, formation of a thin film that causes contaminants can be prevented.

If the inert gas supply nozzle 22d is not installed as described in the current embodiment, the structure of the substrate processing apparatus can be simplified, and thus substrate processing costs can be reduced.

EXAMPLES

Hereinafter, examples of the present invention will be explained together with comparative examples. FIG. 10 is a table showing results of substrate processing according to an example of the present invention. FIG. 9 is a table showing results of substrate processing according to a comparative example.

In the example shown in FIG. 10, while supplying an amine-based zirconium (Zr) source gas through the process gas supply nozzle 22a as a process gas, $O_3$ gas was supplied through the process gas supply nozzle 22b as a process gas, so as to form a Zr oxide film by an ALD method. The in-surface uniformity of the thickness of a Zr oxide film is largely affected by the supply amount of an amine-based Zr source gas. Therefore, in the example, an amine-based Zr source gas was supplied in a state where the amine-based Zr source gas was enclosed at both sides by $N_2$ gas (inert gas). Specifically, in step 1, when an amine-based Zr source gas was supplied through the process gas supply nozzle 22a, $N_2$ gas was supplied at a flowrate of 30 slm through each of the inert gas supply nozzle 22c and the process gas supply nozzle 22b (for example, an allowable supply flowrate of $N_2$ gas (inert gas) was from 20 slm to 30 slm). As shown in FIG. 10, the results were as follows: the average film thickness and in-surface uniformity of a Zr oxide film formed on a wafer 10 charged in an upper part of the boat 11 were 33.7 Å and ±3.8%; the average film thickness and in-surface uniformity of a Zr oxide film formed on a wafer 10 charged in a middle part of the boat 11 were 33.6 Å and ±3.7%; and the average film thickness and in-surface uniformity of a Zr oxide film formed on a wafer 10 charged in an lower part of the boat 11 were 33.6 Å and ±4.1%. The in-surface uniformity of substrate processing was significantly improved as compared with that in the comparative example (described later). In addition, inter-wafer uniformity was ±0.2%, which was significantly improved as compared with that in the comparative example (described later).

In the comparative example shown in FIG. 9, when an amine-based zirconium (Zr) source gas was supplied through the process gas supply nozzle 22a, $N_2$ gas was not supplied through the inert gas supply nozzles 22c and 22d and the process gas supply nozzle 22b. Other conditions were set to be almost the same as those in the example of FIG. 10. As shown in FIG. 9, the results were as follows: the average film thickness and in-surface uniformity of a Zr oxide film formed on a wafer 10 charged in an upper part of the boat 11 were 37.6 Å and ±9.78%; the average film thickness and in-surface uniformity of a Zr oxide film formed on a wafer 10 charged in a middle part of the boat 11 were 36.7 Å and ±8.5%; the average film thickness and in-surface uniformity of a Zr oxide film formed on a wafer 10 charged in an lower part of the boat 11 were 36.5 Å and ±7.3%; and inter-wafer uniformity was ±1.4%.

Another Embodiment of the Invention

The present invention should not be construed as limited to the above-described embodiments. Variations can be made in the present invention without departing form the spirit or scope of the invention.

Figure 11:
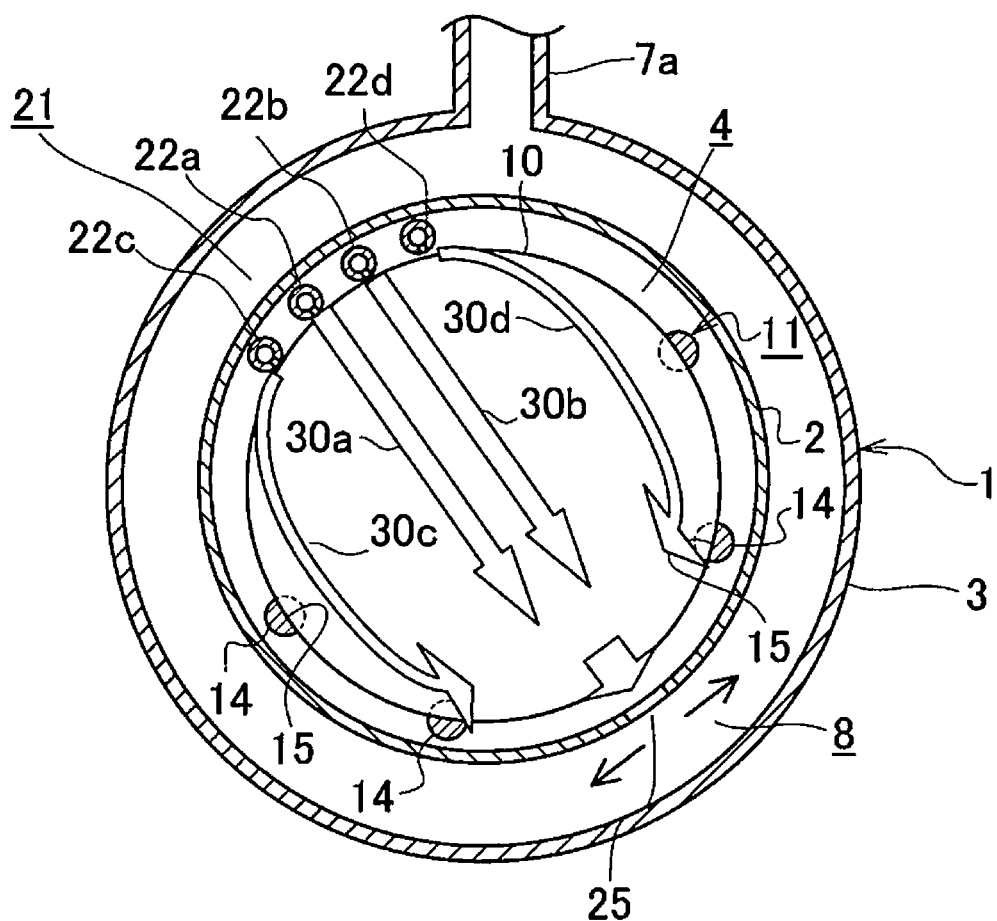
FIG. 11 is a horizontal sectional view illustrating a process furnace of a substrate processing apparatus according to another embodiment of the present invention.

For example, the auxiliary chamber 21 may be not installed at the inner tube 2. That is, as shown in FIG. 11, the process gas supply nozzles 22a and 22b, and the inert gas supply nozzles 22c and 22d may be disposed inwardly in radial directions from the inner circumferential surface of the inner tube 2.

In the above description, the numbers of the process gas ejection holes 24a and 24b, and the numbers of the first inert gas ejection holes 24c and 24d are set to be equal to the number of wafers 10. However, the present invention is not limited thereto. For example, instead of disposing the process gas ejection holes 24a and 24b and the first inert gas ejection holes 24c and 24d at heights corresponding to stacked wafers 10 (that is, at positions corresponding to the number of wafers 10), each of the process gas ejection holes 24a and 24b and the first inert gas ejection holes 24c and 24d may be provided for a plurality of wafers 10.

In addition, although it has been described that the exhaust opening 25 formed in the sidewall of the inner tube 2 has a penetration slit shape, the present invention is not limited thereto. For example, a plurality of long exhaust holes, circular exhaust holes, or polygonal exhaust holes may be formed. In the case where a plurality of exhaust holes 25 are formed instead of the exhaust opening 25, the number of the exhaust holes 25 may be equal to or different from the number of wafers 10. For example, the exhaust holes 25 may be formed at heights corresponding to the stacked wafers 10 (as many exhaust holes 25 as the number of wafers 10), or each of the exhaust holes 25 may be formed for a plurality of wafers 10. Furthermore, in the case where the exhaust opening 25 is formed in a long hole shape (slit shape), the width of the exhaust opening 25 may be varied along the vertical direction of the inner tube 2. Moreover, in the case where a plurality of exhaust holes 25 are formed, the diameters of the exhaust holes 25 may be varied along the vertical direction of the inner tube 2.

In the above-described embodiments, wafers 10 are processed. However, processing targets may be other objects such as photomasks, printed circuit boards, liquid crystal panels, compact disks, and magnetic disks.

Any gas having a thermal decomposition temperature lower than a process temperature (film-forming temperature) may be used as a process gas that is supplied in a state where the process gas is enclosed at left, right, upper, and lower sides by inert gas. For example, TEMAH gas, TEMAZ gas, or TMA gas may be used as a process gas. The thermal decomposition temperatures of TEMAH gas and TEMAZ gas range from 200° C. to 250° C. In addition, in the gas supply nozzles, sources decompose completely (100%) and are attached at 200° C. or higher. In addition, the thermal decomposition temperature of TMA gas ranges from 270° C. to 280° C. Dissociation equilibrium of TMA is known as follows: TMA has a dimer structure in room temperature, and in a vapor phase at about 150° C., TMA dissociates into a monomer structure.

In addition, when a $HfO_2$ film, a $ZrO_2$ film, or an $Al_2O_3$ film is formed using TEMAH gas, TEMAZ gas, or TMA gas, the following exemplary process conditions can be used.

(1) Process Conditions for Forming $HfO_2$ Film
Process temperature: 250° C. (200° C. to 250° C.)
Pressure when TEMAH gas is supplied: 182 Pa
Pressure for vacuuming/purging after TEMAH gas and $O_3$ gas is supplied: 120 Pa to 25 Pa
Pressure when $O_3$ gas is supplied: 85 Pa
TEMAH gas supply time: 180 seconds
Vacuuming/purging time after TEMAH gas is supplied: 33 seconds
$O_3$ gas supply time: 40 seconds
Vacuuming/purging time after $O_3$ gas is supplied: 32 seconds (2) Process Conditions for Forming $ZrO_2$ Film
Process temperature: 220° C. (200° C. to 230° C.)
Pressure when TEMAZ gas is supplied: 182 Pa
Pressure for vacuuming/purging after TEMAZ gas and $O_3$ gas is supplied: 120 Pa to 25 Pa
Pressure when $O_3$ gas is supplied: 85 Pa
TEMAZ gas supply time: 180 seconds
Vacuuming/purging time after TEMAZ gas is supplied: 32 seconds
$O_3$ gas supply time: 40 seconds
Vacuuming/purging time after $O_3$ gas is supplied: 32 seconds (3) Process Conditions for Forming $al_2O_3$ Film
Process temperature: 380° C. (150° C. to 450° C.)
Pressure when TMA gas is supplied: 182 Pa
Pressure for vacuuming/purging after TMA gas and $O_3$ gas is supplied: 120 Pa to 25 Pa
Pressure when $O_3$ gas is supplied: 109 Pa
TMA gas supply time: 20 seconds
Vacuuming/purging time after TMA gas is supplied: 11 seconds
$O_3$ gas supply time: 30 seconds
Vacuuming/purging time after $O_3$ gas is supplied: 17 seconds The substrate processing methods of the present invention can be applied to other substrate processing methods such as an oxide film forming method and a diffusion method.

According to the substrate processing apparatus of the present invention, supply of a process gas to a region where substrates are not stacked can be suppressed but supply of a process gas to a region where substrates are stacked can be facilitated.

<Supplementary Note>

The present invention also includes the following embodiments.

According to an embodiment of the present invention, there is provided a substrate processing apparatus including:

a process chamber configured to accommodate and process substrates which are horizontally oriented and stacked in multiple stages;

a process gas supply unit configured to supply at least one kind of process gas to the process chamber;

an inert gas supply unit configured to supply an inert gas to the process chamber; and an exhaust unit configured to exhaust the process chamber, wherein the process gas supply unit includes at least one process gas supply nozzle extending along an inner wall of the process chamber in a stacked direction of the substrates so as to supply the process gas to the process chamber, the inert gas supply unit includes a pair of inert gas supply nozzles which extend along the inner wall of the process chamber in the stacked direction of the substrates and are disposed at both sides of the process gas supply nozzle along a circumferential direction of the substrates, so as to supply the inert gas to the process chamber, and each of the inert gas supply nozzles includes at least one first inert gas ejection hole formed in a region where the substrates are stacked and at least one second inert gas ejection hole formed in a region where the substrates are not stacked.

Preferably, the region where the substrates are not stacked may include a region higher or lower than the region where the substrates are stacked.

Preferably, the second inert gas ejection hole may be opened toward a centerline of the substrates.

Preferably, the substrate processing apparatus may further include:

a heating unit configured to heat an inside atmosphere of the process chamber; and a control unit configured to control at least the process gas supply unit, the inert gas supply unit, and the heating unit, wherein the control unit controls the process gas supply unit and the inert gas supply unit so that the inert gas is supplied through the first inert gas ejection hole at a flowrate higher than a flowrate of the process gas, and controls the heating unit so that the inside atmosphere of the process chamber is kept at a predetermined process temperature.

Preferably, a process gas may be set higher than a thermal decomposition temperature of the process gas.

According to another embodiment of the present invention, there is provided a substrate processing apparatus including:

an outer tube;

an inner tube installed in the outer tube and having at least one opened end, so as to accommodate substrates that are horizontally oriented and arranged in multiple stages;

a process gas supply unit configured to supply at least one kind of process gas to the process chamber;

an inert gas supply unit configured to supply an inert gas to the process chamber; and an exhaust unit configured to exhaust the process chamber, wherein the process gas supply unit includes at least one process gas supply nozzle erected in the inner tube and extending in a stacked direction of the substrates and including at least one process gas ejection hole to supply the process gas to the process chamber, the inert gas supply unit includes a pair of inert gas supply nozzles extending in the stacked direction of the substrates and erected in the inner tube in a manner such that the inert gas supply nozzles are disposed at both sides of the process gas supply nozzle along a circumferential direction of the substrates, so as to supply the inert gas to process chamber, and each of the inert gas supply nozzles includes at least one first inert gas ejection hole formed in a region where the substrates are stacked and at least one second inert gas ejection hole formed in a region where the substrates are not stacked.

Preferably, the region where the substrates are not stacked may include a region higher or lower than the region where the substrates are stacked.

Preferably, the second inert gas ejection hole may be opened toward a centerline of the substrates.

Preferably, an auxiliary chamber may be formed in the inner tube in a manner such that the auxiliary chamber protrudes outward from the inner tube in a radial direction of the inner tube, the process gas supply nozzle may be installed in the auxiliary chamber, and the process gas ejection hole may be disposed at a position outside the inner surface of the inner tube in a radial direction of the inner tube.

Preferably, an auxiliary chamber may be formed in the inner tube in a manner such that the auxiliary chamber protrudes outward from the inner tube in a radial direction of the inner tube, the pair of inert gas supply nozzles may be installed in the auxiliary chamber, and the first inert gas ejection hole and the second inert gas ejection hole may be disposed at positions outside the inner surface of the inner tube in a radial direction of the inner tube.

Preferably, a first imaginary line connected from the process gas supply nozzle to an exhaust opening may pass across a center region of a substrate.

Preferably, the process gas ejection hole may be approximately parallel with the first imaginary line.

Preferably, second and third imaginary lines connected from the pair of inert gas supply nozzles to the exhaust opening may be disposed at both sides of the first imaginary line.

Preferably, the first inert gas ejection hole may be opened approximately in parallel with the second and third imaginary lines.

Preferably, the first inert gas ejection holes may be opened outward from the second and third imaginary lines.

Preferably, the substrate processing apparatus may further include:

a heating unit configured to heat an inside atmosphere of the process chamber; and a control unit configured to control at least the process gas supply unit, the inert gas supply unit, and the heating unit, wherein the control unit may control the heating unit so that the inside atmosphere of the process chamber is kept at a predetermined process temperature.

Preferably, a process temperature may be set higher than a thermal decomposition temperature of the process gas.

Preferably, the substrate processing apparatus may further include a control unit configured to control the process gas supply unit and the inert gas supply unit, wherein the control unit may control the process gas supply unit and the inert gas supply unit so that the inert gas is supplied through the first inert gas ejection hole at a flowrate higher than a flowrate of the process gas.

Preferably, the substrate processing apparatus may further include:

a heating unit configured to heat an inside atmosphere of the process chamber; and a control unit configured to control at least the process gas supply unit, the inert gas supply unit, and the heating unit, wherein the control unit may control the process gas supply unit and the inert gas supply unit so that the inert gas is supplied through the first inert gas ejection hole at a flowrate higher than a flowrate of the process gas, and may control the heating unit so that the inside atmosphere of the process chamber is kept at a predetermined process temperature.

According to another embodiment of the present invention, there is provided a substrate processing apparatus configured to supply at least two kinds of process gases to surfaces of substrates in turns for predetermined times in a manner such that the process gases are not mixed with each other so as to form thin films on the substrates, the substrate processing apparatus including:

a process chamber configured to accommodate and process substrates which are horizontally oriented and stacked in multiple stages;

a process gas supply unit configured to supply at least two kinds of process gases to the process chamber;

an inert gas supply unit configured to supply an inert gas to the process chamber; and an exhaust unit configured to exhaust the process chamber, wherein the process gas supply unit includes at least two process gas supply nozzles extending along an inner wall of the process chamber in a stacked direction of the substrates so as to supply the process gases to the process chamber, the inert gas supply unit includes a pair of inert gas supply nozzles which extend along the inner wall of the process chamber in the stacked direction of the substrates and are disposed at both sides of at least one of the process gas supply nozzles along a circumferential direction of the substrates, so as to supply the inert gas to the process chamber, and each of the inert gas supply nozzles includes at least one first inert gas ejection hole formed in a region where the substrates are stacked and at least one second inert gas ejection hole formed in a region where the substrates are not stacked.

Preferably, the region where the substrates are not stacked may include a region higher or lower than the region where the substrates are stacked.

Preferably, the second inert gas ejection hole may be opened toward a centerline of the substrates.

Preferably, one of the process gas supply nozzles enclosed at both sides by the pair of inert gas supply nozzles may supply a process gas having influence on in-surface thickness uniformity of a thin film.

Preferably, the process gas supply unit may include:

a first process gas supply nozzle configured to supply a first process gas having influence on in-surface thickness uniformity of a thin film; and a second process gas supply nozzle configured to supply a second process gas having on influence on in-surface thickness uniformity of a thin film, wherein the first process gas supply nozzle may be enclosed at both sides by the pair of inert gas supply nozzles disposed along the circumferential direction of the substrates.

According to another embodiment of the present invention, there is provided a substrate processing apparatus including:

a process chamber configured to accommodate and process substrates which are horizontally oriented and arranged in multiple stages;

at least one process gas supply nozzle extending along an inner wall of the process chamber in a stacked direction of the substrates so as to supply the process gas to the process chamber;

a pair of inert gas supply nozzles extending along the inner wall of the process chamber in the stacked direction of the substrates so as to supply the inert gas to the process chamber; and an exhaust line configured to exhaust the process chamber, wherein the pair of inert gas supply nozzles are arranged such that a flow passage of a process gas supplied through the process gas supply nozzle is restricted by inert gas streams supplied through first inert gas ejection holes.

According to another embodiment of the present invention, there is provided a substrate processing apparatus including:

a process chamber configured to accommodate and process substrates which are horizontally oriented and arranged in multiple stages;

at least one process gas supply nozzle extending along an inner wall of the process chamber in a stacked direction of the substrates so as to supply the process gas to the process chamber;

a pair of inert gas supply nozzles extending along the inner wall of the process chamber in the stacked direction of the substrates so as to supply the inert gas to the process chamber; and an exhaust line configured to exhaust the process chamber, wherein while the pair of inert gas supply nozzles supply an inert gas to a gap between the substrates and the process chamber, the pair of inert gas supply nozzles supply an inert gas to a region higher or lower than a region where the substrates are stacked.

According to another embodiment of the present invention, there is provided a substrate processing apparatus including:

a process chamber configured to accommodate and process substrates which are horizontally oriented and arranged in multiple stages;

at least one process gas supply nozzle extending along an inner wall of the process chamber in a stacked direction of the substrates so as to supply the process gas to the process chamber;

a pair of inert gas supply nozzles which extend along the inner wall of the process chamber in the stacked direction of the substrates and are disposed at both sides of the process gas supply nozzle, wherein while the inert gas supply nozzles supply an inert gas to the process chamber, the inert gas supply nozzles supply the inert gas to a region higher or lower than a region where the substrates are stacked; and an exhaust line configured to exhaust the process chamber.

Preferably, when a process gas is supplied through the process gas supply nozzle, an inert gas may be supplied through the first inert gas ejection holes of the inert gas supply nozzles at flowrates greater than the flowrate of the process gas.

Preferably, when a process gas is supplied through one of the process gas supply nozzles, at least one of the other process gas supply nozzles may supply an inert gas at a flowrate greater than the flowrate of the process gas.

According to another embodiment of the present invention, there is provided a substrate processing apparatus including:

a substrate holding tool configured to hold substrates in a state where the substrates are horizontally oriented and stacked in multiple stages;

a process chamber configured to accommodate the substrate holding tool in which the substrates are held so as to process the substrates;

a process gas supply unit configured to supply a process gas to the process chamber;

an inert gas supply unit configured to supply an inert gas to the process chamber; and an exhaust unit configured to exhaust the process chamber, wherein the process gas supply unit includes a process gas supply nozzle extending along an inner wall of the process chamber in a stacked direction of the substrates so as to supply the process gas to the process chamber, the inert gas supply unit includes an inert gas supply nozzle extending along the inner wall of the process chamber in the stacked direction of the substrates so as to supply the inert gas to the process chamber, and the inert gas supply nozzle includes at least one inert gas ejection hole formed in a region where the substrates are not stacked.

Preferably, an insulating plate may be charged in the substrate holding tool at a position lower than the substrates, and the at least one inert gas ejection hole may be formed in a region corresponding to the insulating plate and in which the substrates are not stacked.

Preferably, the substrate holding tool may include a pair of upper and lower end plates and a plurality of holding members vertically installed between the upper and lower end plates, and the at least one inert gas ejection hole may be formed in a region as high as or higher than the upper end plate and in which the substrates are not stacked.

According to another embodiment of the present invention, there is provided a semiconductor device manufacturing method including:

loading substrates, which are horizontally oriented and arranged in multiple stages, into a process chamber;

processing the substrates by supplying a process gas to the process chamber through at least one process gas supply nozzle extending along an inner wall of the process chamber in a stacked direction of the substrates, and supplying an inert gas to a gap between the inner wall of the process chamber and the substrates and a region higher or lower than a region where the substrates are stacked through a pair of inert gas supply nozzles, wherein the inert gas supply nozzles extend along the inner wall of the process chamber in the stacked direction of the substrates and are disposed at both sides of the process gas supply nozzle in a circumferential direction of the substrates; and unloading the processed substrates from the process chamber.

Preferably, in the processing of the substrates, each of the pair of inert gas supply nozzles may supply an inert gas at a flowrate greater than a flowrate of a process gas supplied through the process gas supply nozzle.

According to another embodiment of the present invention, there is provided a semiconductor device manufacturing method for forming thin films on surfaces of substrates by supplying at least two kinds of process gases to the surfaces of the substrates by turns for predetermined times in a manner such that the process gases are not mixed with each other, the method including:

loading substrates, which are horizontally oriented and arranged in multiple stages, into a process chamber;

supplying a first process gas to the process chamber;

exhausting the process chamber;

supplying a source process gas to the process chamber; and exhaust the process chamber, wherein in at least one process of the supplying of the first process gas and the supplying of the second process gas, while an inert gas is supplied so that a stream of the first process gas or the second process gas is enclosed at both sides by the inert gas, the inert gas is supplied to a region higher or lower than a region where the substrates are stacked.

According to another embodiment of the present invention, there is provided a substrate processing apparatus including:

a process chamber configured to accommodate substrates which are horizontally oriented and stacked in multiple stages and process the substrates;

a process gas supply unit configured to supply a process gas to the process chamber;

an inert gas supply unit configured to supply an inert gas to the process chamber; and an exhaust unit configured to exhaust the process chamber, wherein the process gas supply unit includes a process gas supply nozzle extending along an inner wall of the process chamber in a stacked direction of the substrates and including a process gas ejection hole to supply the process gas to the process chamber, the inert gas supply unit includes an inert gas supply nozzle which extends along the inner wall of the process chamber in the stacked direction of the substrates and is disposed adjacent to the process gas supply nozzle in a circumferential direction of the substrates, so as to supply the inert gas to the process chamber, and the inert gas supply nozzle includes inert gas ejection holes formed at positions higher and/or lower than a region where the process gas ejection hole is formed in the process gas supply nozzle.

What is claimed is:

1. A substrate processing apparatus comprising:

a substrate holding tool comprising: a lower end plate; an upper end plate disposed above the lower end plate; and holding members vertically provided between the lower end plate and the upper end plate, wherein substrates are held by the holding members and stacked in a region between the lower end plate and the upper end plate;

a process chamber where the substrates loaded in the substrate holding tool are processed;

a process gas supply unit configured to supply a process gas to the process chamber, the process gas supply unit comprising a process gas supply nozzle extending along an inner wall of the process chamber in a stacked direction of the substrates so as to supply the process gas to the process chamber, and the process gas supply nozzle comprising: a first upper portion, a first middle portion, a first lower portion, and a plurality of process gas ejection holes provided only at the first middle portion exclusive of the first upper portion and the first lower portion to face substrates held by the holding members in the region between the lower end plate and the upper end plate, wherein the first middle portion is disposed in the region between the lower end plate and the upper end plate where the substrates loaded in the substrate holding tool are present, the first upper portion extends upward from the first middle portion into a region higher than the upper end plate where the substrates are not present, and the first lower portion extends downward from the first middle portion into a region lower than the lower end plate where the substrates are not present;

an inert gas supply unit configured to supply an inert gas to the process chamber, the inert gas supply unit comprising a first inert gas supply nozzle disposed on a first side of the process gas supply nozzle and a second inert gas supply nozzle disposed on a second side of the process gas supply nozzle opposite to the first side along a circumferential direction of the substrates, wherein each of the first inert gas supply nozzle and the second inert gas supply nozzle extends along the inner wall of the process chamber in the stacked direction of the substrates so as to supply the inert gas to the process chamber, and each of the first inert gas supply nozzle and the second inert gas supply nozzle comprises: a second upper portion, a second middle portion, a second lower portion, a plurality of first inert gas ejection holes, and a plurality of second inert gas ejection holes, wherein the second middle portion is disposed in the region between the lower end plate and the upper end plate where the substrates loaded in the substrate holding tool are present, the second upper portion extends upward from the second middle portion into the region higher than the upper end plate where the substrates are not present, the second lower portion extends downward from the second middle portion into the region lower than the lower end plate where the substrates are not present, the plurality of first inert gas ejection holes is provided only at the second middle portion exclusive of the second upper portion and the second lower portion to face the substrates stacked in the region between the lower end plate and the upper end plate, and the plurality of second inert gas ejection holes is provided only at the second upper portion and the second lower portion exclusive of the second middle portion such that the plurality of second inert gas ejection holes does not face the substrates stacked in the region between the lower end plate and the upper end plate;

an exhaust unit configured to exhaust the process chamber; and an exhaust opening disposed on a sidewall of the process chamber opposite to the process gas supply nozzle such that: a first imaginary line connecting the process gas supply nozzle and the exhaust opening passes through a center region of the substrates, a second imaginary line connecting the first inert gas supply nozzle and the exhaust opening is disposed at a first side of the first imaginary line, and a third imaginary line connecting the second inert gas supply nozzle and the exhaust opening is disposed at a second side of the first imaginary line opposite to the first side of the first imaginary line, wherein the plurality of first inert gas ejection holes provided only at the second middle portion of the first inert gas supply nozzle points outward from the second imaginary line, and the plurality of first inert gas ejection holes provided only at the second middle portion of the second inert gas supply nozzle points outward from the third imaginary line.

2. The substrate processing apparatus of claim 1, wherein the plurality of second inert gas ejection holes provided only at the second upper portion and the second lower portion is opened toward a centerline of the substrates.

3. The substrate processing apparatus of claim 1, further comprising:

a heater configured to heat an inside atmosphere of the process chamber; and a control unit configured to control at least the process gas supply unit, the inert gas supply unit, and the heater, wherein the control unit controls the process gas supply unit and the inert gas supply unit so that the inert gas is supplied through the plurality of first inert gas ejection holes at a flowrate higher than a flowrate of the process gas, and controls the heater so that the inside atmosphere of the process chamber is kept at a predetermined process temperature.

4. The substrate processing apparatus of claim 1, wherein a process temperature is set higher than a thermal decomposition temperature of the process gas.

* * * * *